(12) United States Patent
Chiang et al.

(10) Patent No.: US 12,334,424 B2
(45) Date of Patent: Jun. 17, 2025

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Kai-Ming Chiang, Taichung (TW); Wei-Jhan Tsai, Kaohsiung (TW); Sheng-Feng Weng, Taichung (TW); Ching-Yao Lin, New Taipei (TW); Ming-Yu Yen, MiaoLi County (TW); Kai-Fung Chang, Taipei (TW); Chih-Wei Lin, Hsinchu County (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 499 days.

(21) Appl. No.: 17/709,470

(22) Filed: Mar. 31, 2022

(65) Prior Publication Data

US 2023/0317585 A1    Oct. 5, 2023

(51) Int. Cl.
*H01L 23/02* (2006.01)
*H01L 21/48* (2006.01)
(Continued)

(52) U.S. Cl.
CPC .... *H01L 23/49822* (2013.01); *H01L 21/4857* (2013.01); *H01L 21/486* (2013.01);
(Continued)

(58) Field of Classification Search
CPC .......... H01L 23/49822; H01L 21/4857; H01L 21/486; H01L 23/49816; H01L 23/5383; H01L 23/5386; H01L 24/24; H01L 24/32; H01L 24/48; H01L 2224/32145; H01L 2224/32225; H01L 2224/32235;
(Continued)

(56) References Cited

U.S. PATENT DOCUMENTS

| 8,993,380 B2 | 3/2015 | Hou et al. |
| 9,000,584 B2 | 4/2015 | Lin et al. |

(Continued)

*Primary Examiner* — Theresa T Doan
(74) *Attorney, Agent, or Firm* — JCIPRNET

(57) ABSTRACT

A package structure includes a first redistribution circuit structure, a semiconductor die, a connecting film, and a second redistribution circuit structure. The first redistribution circuit structure includes a dielectric structure and a routing structure disposed therein, where the dielectric structure includes a trench exposing the routing structure. The semiconductor die is disposed on and electrically coupled to the first redistribution circuit structure. The connecting film is disposed in the trench and between the semiconductor die and the first redistribution circuit structure, and the semiconductor die is thermally coupled to the routing structure through the connecting film. The second redistribution circuit structure is disposed on and electrically coupled to the semiconductor die, the second redistribution circuit structure is electrically coupled to the first redistribution circuit structure, and the semiconductor die is disposed between the first redistribution circuit structure and the second redistribution circuit structure.

20 Claims, 23 Drawing Sheets

(51) Int. Cl.
*H01L 23/00* (2006.01)
*H01L 23/498* (2006.01)
*H01L 23/538* (2006.01)
*H01L 25/10* (2006.01)
*H01L 25/065* (2023.01)

(52) U.S. Cl.
CPC .. *H01L 23/49816* (2013.01); *H01L 23/49838* (2013.01); *H01L 23/5383* (2013.01); *H01L 23/5386* (2013.01); *H01L 23/5389* (2013.01); *H01L 24/24* (2013.01); *H01L 24/32* (2013.01); *H01L 24/73* (2013.01); *H01L 25/105* (2013.01); *H01L 24/48* (2013.01); *H01L 25/0657* (2013.01); *H01L 2224/24226* (2013.01); *H01L 2224/32145* (2013.01); *H01L 2224/32225* (2013.01); *H01L 2224/32235* (2013.01); *H01L 2224/48228* (2013.01); *H01L 2224/73265* (2013.01); *H01L 2224/73267* (2013.01); *H01L 2225/0651* (2013.01); *H01L 2225/06524* (2013.01); *H01L 2225/06568* (2013.01); *H01L 2225/1023* (2013.01); *H01L 2225/1041* (2013.01); *H01L 2225/1058* (2013.01); *H01L 2225/1094* (2013.01); *H01L 2924/182* (2013.01)

(58) Field of Classification Search
CPC . H01L 2224/48228; H01L 2224/73265; H01L 2225/0651; H01L 2225/1058; H01L 2225/1094; H01L 2924/182
USPC .......................................................... 257/686
See application file for complete search history.

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2020/0303335 A1* | 9/2020 | Chu ....................... H01L 24/20 |

* cited by examiner

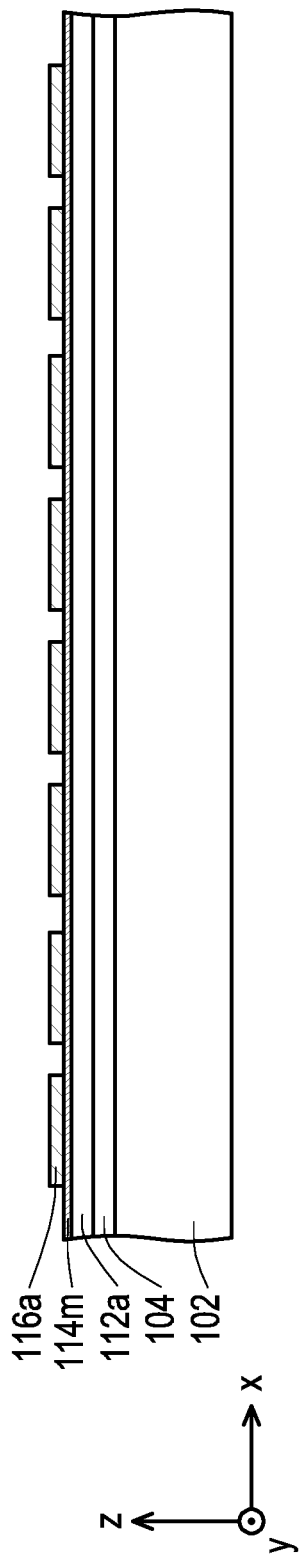
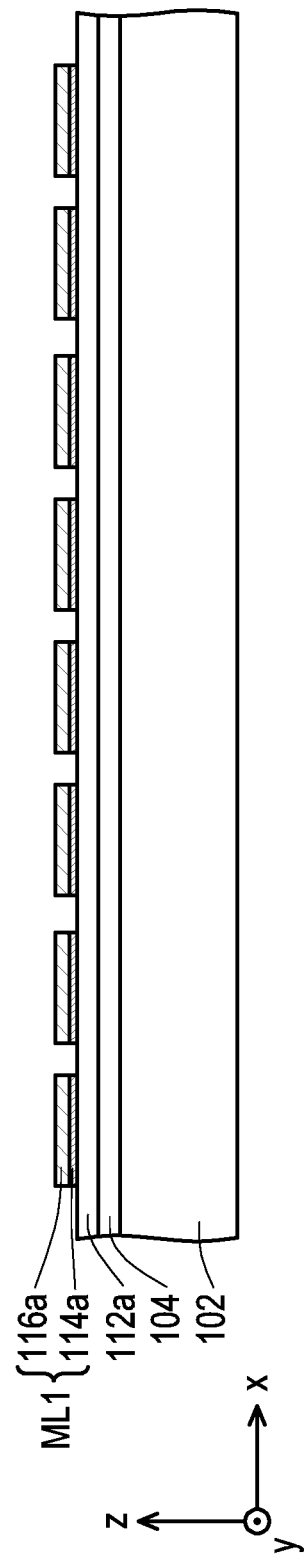
FIG. 1
FIG. 2

PACKAGE STRUCTURE AND MANUFACTURING METHOD THEREOF

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIG. 13 are schematic cross-sectional views of various stages in a manufacturing method of a package structure in accordance with some embodiments of the disclosure.

DETAILED DESCRIPTION

Figure 3:
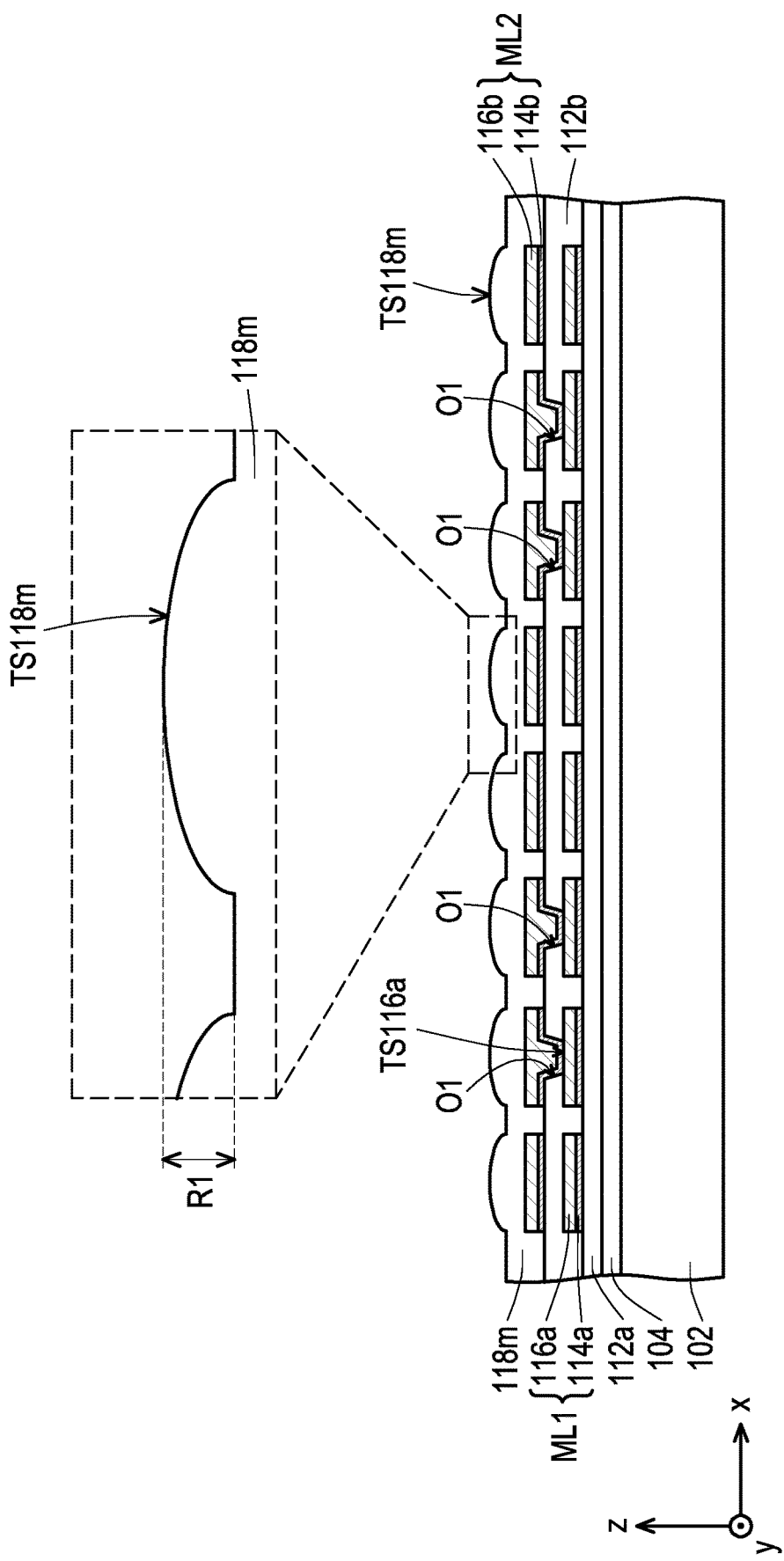

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments include a (semiconductor) package structure including a semiconductor die with a back-side redistribution circuit structure. In one scenario, due to the presence of the back-side redistribution circuit structure included in the package structure, an uneven outermost surface (e.g., an uneven topography, for example, a surface roughness of a surface peak to a surface valley being greater than or substantially equal to 4 μm (such as about 4 μm to about 7 μm)) of the back-side redistribution circuit structure, which is disposed with the semiconductor die, would cause air or void being trapped between the semiconductor die and the back-side redistribution circuit structure after the semiconductor die being placing onto the back-side redistribution circuit structure. With the air or void trapped between the semiconductor die and the back-side redistribution circuit structure, an undesired movement of the semiconductor die and/or an insulating encapsulation surrounding the semiconductor die may occur during a thermal process, which reduces the reliability and performance of the package structure. In addition, with the air or void trapped between the semiconductor die and the back-side redistribution circuit structure, moisture may be trapped by the void and have the risk of "pop-corn" (e.g., water transfers from a liquid phase to a gas phase) during high temperature reliability test. Embodiments address this issue by utilizing an addition planarizing process on the back-side redistribution circuit structure prior to the placement of the semiconductor die, which is capable of providing a smooth outer surface of the back-side redistribution circuit structure, thereby facilitating the placement of the semiconductor die and enhancing the reliability and performance of the package structure.

In other scenarios, due to the presence of the back-side redistribution circuit structure in the package structure, a thermal dissipating distance for heat generated by the semiconductor die to the external is increased, which decreases the heat dissipation of the package structure. As a result, reliability and performance of the package structure may be reduced. Embodiments address this issue by utilizing a thermal conduction layer or film being disposed between the semiconductor die and the back-side redistribution circuit structure, adhering the semiconductor die directly onto conductive features included in the back-side redistribution circuit structure, or a combination thereof to facilitate the heat dissipation, thereby improving the reliability and performance of the package structure.

Figure 14:
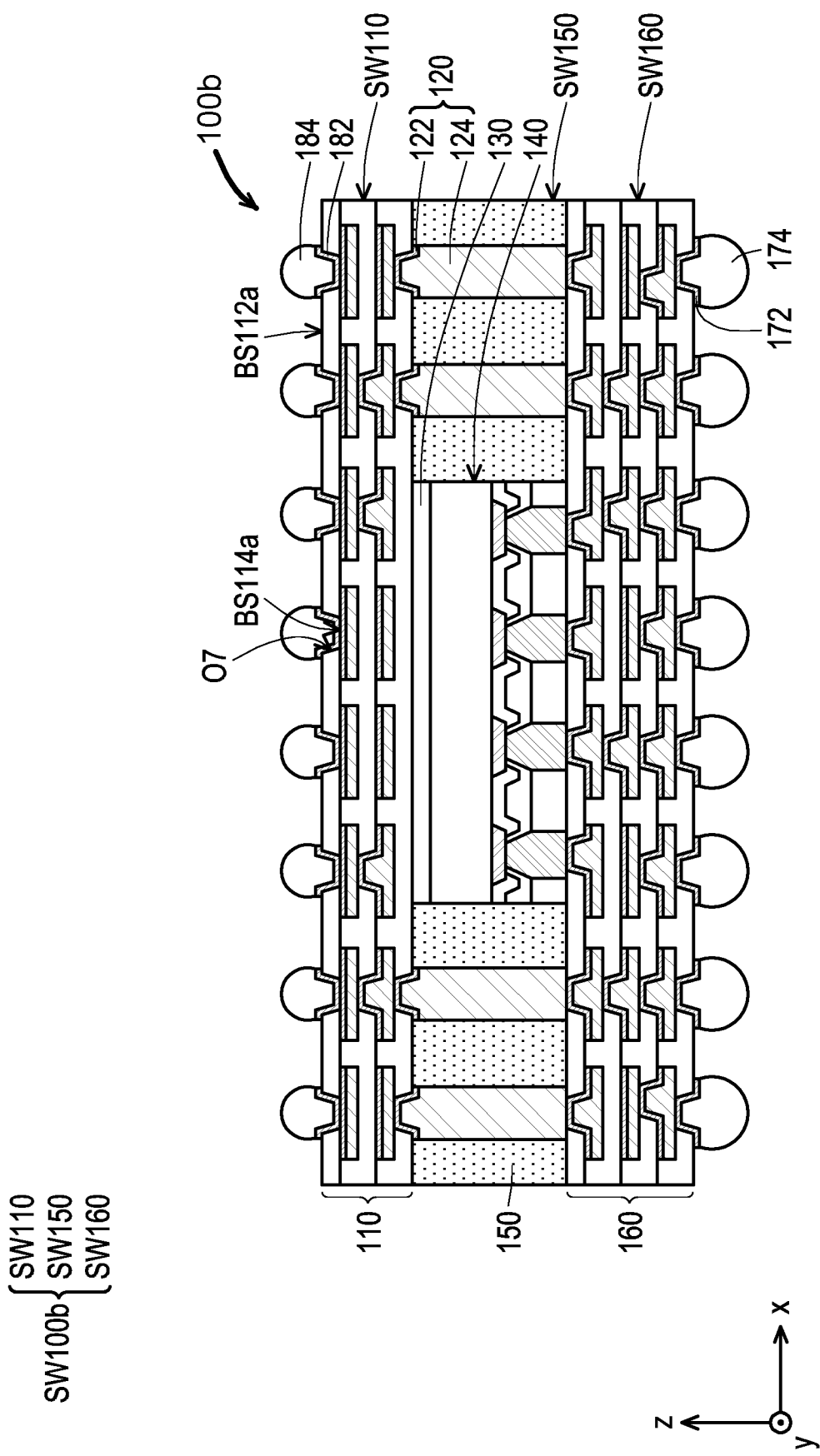
FIG. 14 is a schematic cross-sectional view of a package structure in accordance with some embodiments of the disclosure.
Figure 15:
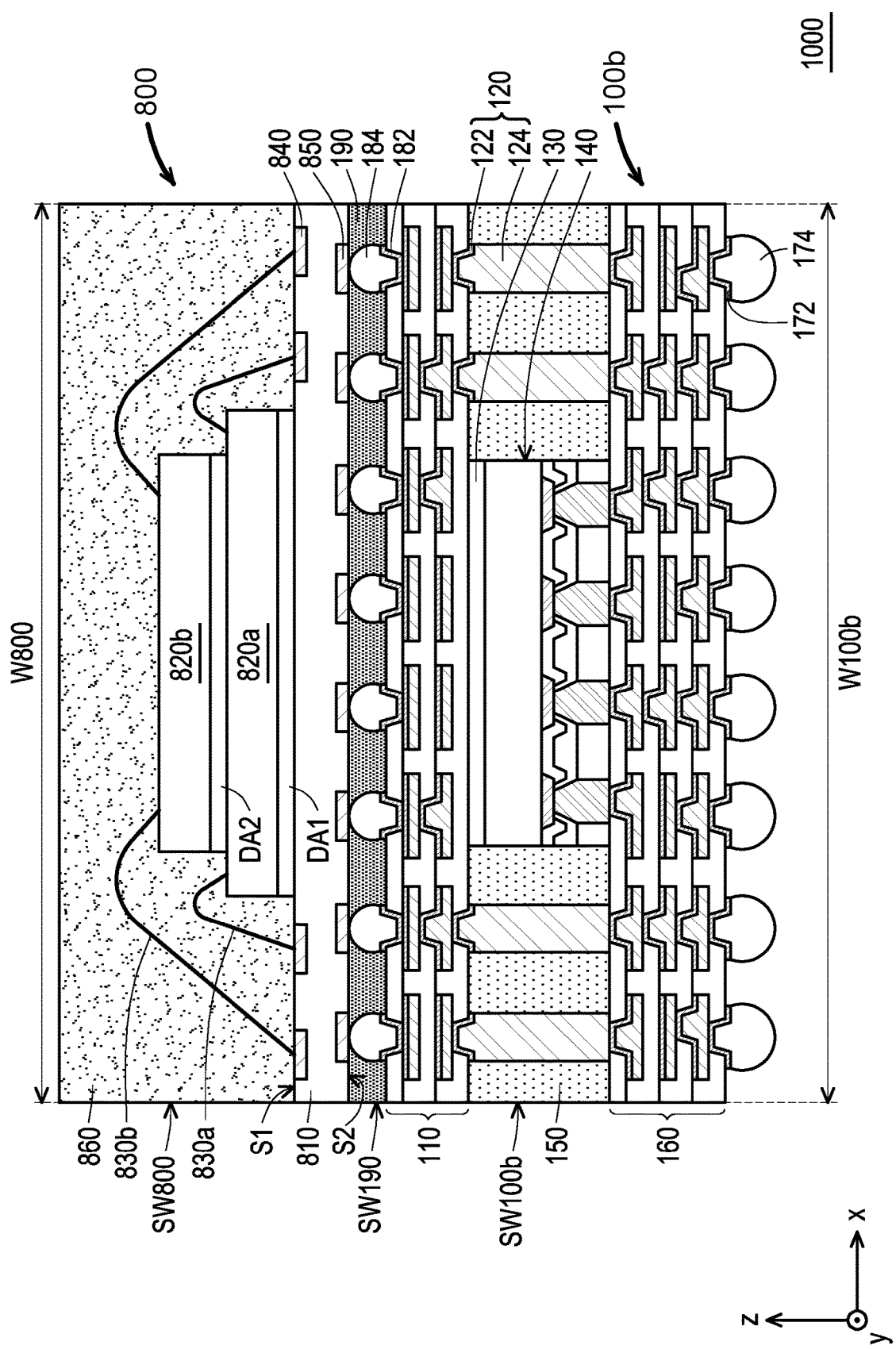
FIG. 15 is a schematic cross-sectional view of a package structure in accordance with some embodiments of the disclosure.
Figure 16:
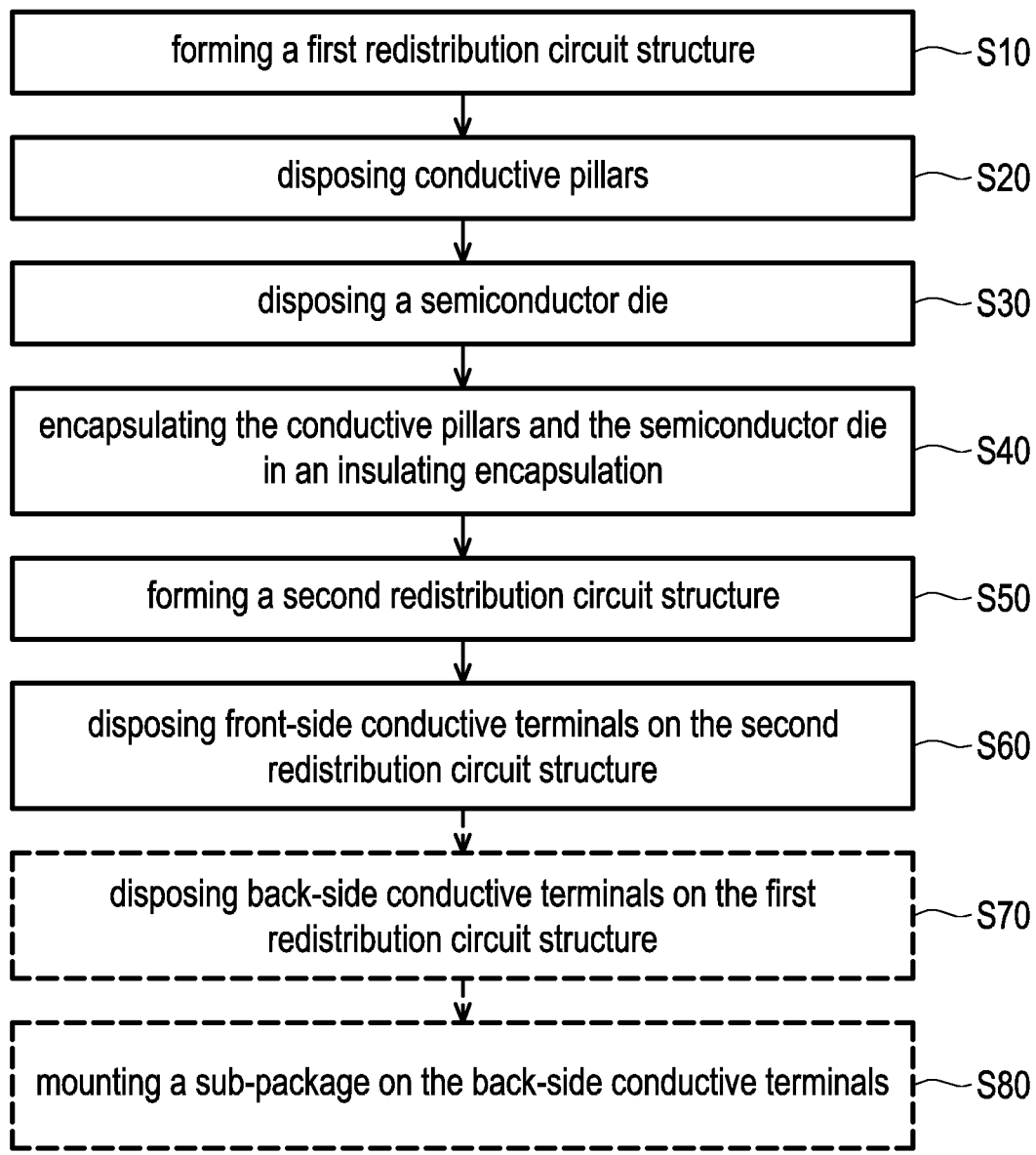
FIG. 16 is a flow chart illustrating a method of manufacturing a package structure in accordance with some embodiments of the disclosure.
Figure 17:
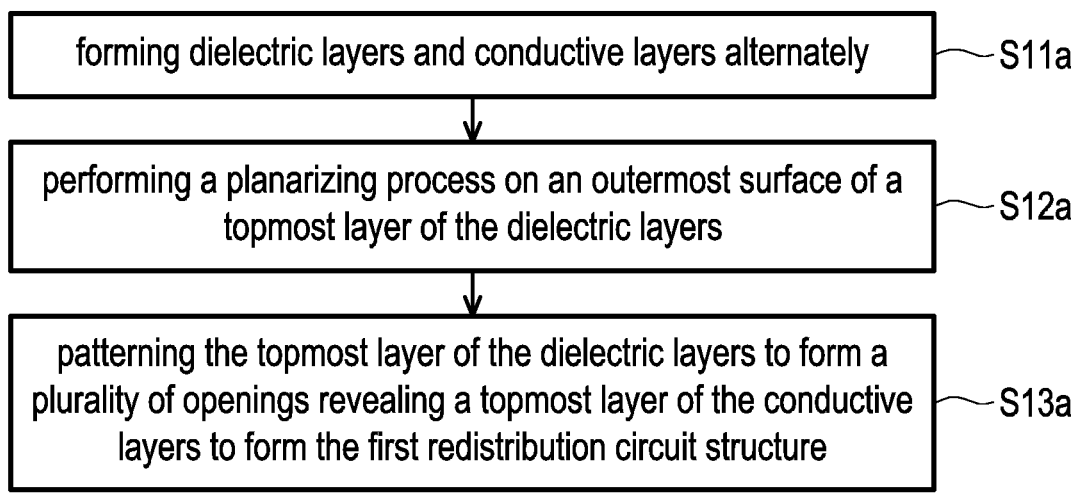
FIG. 17 is a flow chart illustrating a method of manufacturing a redistribution circuit structure in accordance with some embodiments of the disclosure.

FIG. 1 through FIG. 13 are schematic cross-sectional views of various stages in a manufacturing method of a package structure 100a in accordance with some embodiments of the disclosure. The embodiments are intended to provide further explanations but are not used to limit the scope of the disclosure. The formation of the package structure 100a may be used in any of the embodiments relating to an enhancing element discussed below. FIG. 1 through FIG. 13 illustrate schematic cross-sectional views of intermediate steps of a process for forming the package structure 100a until the package structure 100a is ready to receive an additional component such as additional conductive terminals (for example, 184 as shown in FIG. 14) or/and an additional device such as another package (for example, 800 as shown in FIG. 15). In the disclosure, it should be appreciated that the illustration of components throughout all figures is schematic and is not in scale. FIG. 16 is a flow chart illustrating a method of manufacturing a package structure in accordance with some embodiments of the disclosure. FIG. 17 illustrates a flow chart illustrating a method of manufacturing a redistribution circuit structure of the package structure 100a in accordance with some embodiments of the disclosure. In embodiments, the manufacturing method is part of a wafer level packaging process. It is to be noted that the process steps described herein cover a portion of the manufacturing processes used to fabricate a package structure.

Referring to FIG. 1, in some embodiments, a carrier substrate 102 is provided for the package structure 100a, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material (such as benzocyclobutene (BCB), polybenzoxazole (PBO)), which may be removed along with the carrier substrate 102 from the overlying structures that will be formed in subsequent steps.

In some embodiments, the release layer 104 is an epoxy-based thermal-release material, which loses its adhesive property when heated, such as a light-to-heat-conversion (LTHC) release coating. In other embodiments, the release layer 104 is an ultra-violet (UV) glue, which loses its adhesive property when exposed to UV lights. The release layer 104 may be dispensed as a liquid and cured, may be a lamination film laminated onto the carrier substrate 102, or may be the like. An illustrated top surface of the release layer 104, which is opposite to a bottom surface contacting the carrier substrate 102, may be leveled. For example, the illustrated top surface of the release layer 104 has high coplanarity to facilitate forming processes of the overlying structures. For example, the release layer 104 is a LTHC layer with good chemical resistance, and such layer enables room temperature debonding from the carrier substrate 102 by applying laser irradiation, however the disclosure is not limited thereto.

In some embodiments, a redistribution circuit structure 110 is formed on the release layer 104 and over the carrier substrate 102, in accordance with step S10 of FIG. 16 in conjunction with steps S11a, S12a and S13a of FIG. 17. In some embodiments, as shown in FIG. 1 to FIG. 5, the redistribution circuit structure 110 includes at least one dielectric layer 112 (e.g., 112a and 112b), at least one seed layer 114 (e.g., 114a and 114b), at least one conductive layer 116 (e.g., 116a and 116b), and a dielectric layer 118a. However, in the disclosure, the numbers of layers of the dielectric layer 112, the seed layer 114, and the conductive layer 116 are not limited to what is depicted in FIG. 1 to FIG. 5, where the numbers of the layers of the dielectric layer 112, the seed layer 114, and the conductive layer 116 may be one or more than one depending upon the demand and design requirements. In some embodiments, one conductive layer 116 includes a line portion extending along a horizontal direction (e.g., a direction X or Y), a via portion extending along a vertical direction (e.g., a direction Z) connecting to the line portion, or a combination thereof. The directions X, Y and Z may be different from each other. For example, as shown in FIG. 1, the directions X, Y and Z are perpendicular to each other.

As illustrated in FIG. 1, in some embodiments, a dielectric layer 112a is formed on the release layer 104 and over the carrier substrate 102. The dielectric layer 112a is disposed on (e.g., in physical contact with) the release layer 104 and extends over (e.g., spans across) the illustrated top surface of the release layer 104, as shown in FIG. 1. In some embodiments, the dielectric layer 112a is formed by, but not limited to, forming a blanket layer of dielectric material over the illustrated top surface of the release layer 104 to completely cover the release layer 104. The material of the dielectric layer 112a may be polyimide (PI), PBO, BCB, a nitride such as silicon nitride, an oxide such as silicon oxide, phosphosilicate glass (PSG), borosilicate glass (BSG), boron-doped phosphosilicate glass (BPSG), a combination thereof, or the like, which may be patterned using a photolithography and/or etching process. The etching process may include a dry etching, a wet etching, or a combination thereof. In some embodiments, the dielectric material blanket layer is formed by suitable fabrication techniques such as spin-on coating, chemical vapor deposition (CVD), (e.g., plasma-enhanced chemical vapor deposition (PECVD)), or the like.

Thereafter, a seed material layer 114m is formed on the dielectric layer 112a and over the release layer 104 and the carrier substrate 102, for example. In some embodiments, the seed material layer 114m is disposed on (e.g., in physical contact with) the dielectric layer 112a and extends over an illustrated top surface of the dielectric layer 112a. The seed material layer 114m may be formed on the dielectric layer 112a in a manner of a blanket layer made of metal or metal alloy materials; the disclosure is not limited thereto. In some embodiments, the seed material layer 114m is referred to as a metal layer, which can be a single layer or a composite layer including a plurality of sub-layers formed of different materials. In some embodiments, the seed material layer 114m includes titanium, copper, molybdenum, tungsten, titanium nitride, titanium tungsten, combinations thereof, or the like. For example, the seed material layer 114m includes a titanium layer and a copper layer over the titanium layer.

The seed material layer 114m may be formed through sputtering, physical vapor deposition (PVD), or the like. In some embodiments, the seed material layer 114m is conformally formed on the dielectric layer 112a by sputtering, and is in (physical) contact with the dielectric layer 112a (e.g., its illustrated top surface). Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. As shown in FIG. 1, the conductive layer 116a may include a plurality of line portions extending along the horizontal direction (e.g., the direction X and/or the direction Y). However, the disclosure is not limited thereto.

In some embodiments, after the formation of the seed material layer 114m, a conductive layer 116a is formed on the seed material layer 114m and over the dielectric layer 112a, as shown in FIG. 1. For example, the conductive layer 116a is disposed on (e.g., in physical contact with) an illustrated top surface of the seed material layer 114m. In some embodiments, the conductive layer 116a is formed by, but not limited to, forming a first photo resist layer (not shown) over the seed material layer 114m; patterning the first photo resist layer to form a plurality of first openings (not shown) penetrating the first photo resist layer and exposing portions of the seed material layer 114m underneath thereto; and forming a first conductive material (not shown) in the first openings to be in (physical) contact with the exposed portions of the seed material layer 114m to form the conductive layer 116a. After the formation of the conductive layer 116a in the first openings formed in the first photo resist layer, the first photo resist layer is removed. As shown in FIG. 1, the conductive layer 116a may include a plurality of conductive patterns/segments (not labeled, which are separated from one another) disposed on the seed material layer 114m, where portions of the seed material layer 114m may not be covered by the conductive layer 116a.

The first photo resist layer may be formed by spin coating or the like, and may be exposed to light for patterning. In some embodiments, a material of the first photo resist layer includes a positive resist material or a negative resist material, that is suitable for a patterning process such as a photolithography process with a mask or a mask-less photolithography process (such as an electron-beam (e-beam) writing or an ion-beam writing). In the disclosure, the first photo resist layer may be referred to as a photoresist layer, a photo resist, or a resist layer. In some embodiments, the pattern of the first photo resist layer is corresponding to the positioning locations of the conductive patterns/segments of the conductive layer 116a. In some embodiments, the first photo resist layer may be removed by acceptable ashing process and/or photoresist stripping process, such as using an oxygen plasma or the like, and the disclosure is not limited thereto.

The first conductive material may be formed in the first openings formed in the first photo resist layer by plating (such as electroplating or electroless plating) or the like. The first conductive material may comprise a metal, such as copper, aluminum, gold, nickel, silver, palladium, tin, or the like. The conductive layer 116a may be high lead or lead-free. The disclosure is not specifically limited thereto.

In alternative embodiments, the conductive layer 116a is formed by, but not limited to, forming a blanket layer of the first conductive material over the seed material layer 114m; and patterning the first conductive material blanket layer to form the conductive layer 116a having a plurality of conductive patterns or segments separated from one another. The blanket layer of the first conductive material may be formed by electroplating, deposition, or lamination. The conductive patterns or segments may be formed by using a photolithography and etching process. The etching process may include a dry etching, a wet etching, or a combination thereof. The disclosure is not limited thereto.

Referring to FIG. 2, in some embodiments, the see layer material 114m is patterned to form a seed layer 114a exposing portions of the dielectric layer 112a. The seed layer 114a is disposed between (e.g., in physical contact with) the dielectric layer 112a and the conductive layer 116a, for example. In some embodiments, the seed layer material 114m is patterned by using the conductive layer 116a as an etching mask to form the seed layer 114a. For example, the etching process may be a dry etching process, a wet etching process, or a combination thereof; the disclosure is not limited thereto. As shown in FIG. 2, the seed layer 114a may include a plurality of conductive patterns/segments (not labeled, which are separated from one another) disposed on the dielectric layer 112a, where portions of the dielectric layer 112a are not covered by the seed layer 114a.

For example, in a vertical projection on the dielectric layer 112a along the direction Z, the conductive layer 116a is completely overlapped with the seed layer 114a. That is to say, a sidewall of the conductive layer 116a is substantially aligned with a sidewall of the seed layer 114a. For example, the conductive layer 116a and the seed layer 114a share the same geometrical shape on a top view, e.g., on a X-Y plane. In some embodiments, as shown in FIG. 2, the conductive layer 116a is physically connected to and electrically connected to the seed layer 114a respectively underlying thereto. In some embodiments, the conductive layer 116a and the seed layer 114a together are referred to as a metallization layer ML1 (or a redistribution layer/line) of the redistribution circuit structure 110. In some embodiments, the dielectric layer 112a and the metallization layer ML1 (including the seed layer 114a and the conductive layer 116a) are referred to as a first build-up layer of the redistribution circuit structure 110.

Referring to FIG. 3, in some embodiments, a dielectric layer 112b, a seed layer 114b, a conductive layer 116b, and a dielectric material layer 118m are sequentially formed on the structure depicted on FIG. 2. For example, the dielectric layer 112b is disposed on (e.g., in physical contact with) the first build-up layer of the redistribution circuit structure 110, and covers an illustrated top surface of the conductive layer 116a, the illustrated top surface of the dielectric layer 112a exposing by the conductive layer 116a, and the sidewalls of the conductive layer 116a and the seed layer 114a. In some embodiments, the dielectric layer 112b has a plurality of openings O1 each exposing a portion of the conductive layer 116a. As show in FIG. 3, through the openings O1, a surface TS116a of the conductive layer 116a is partially exposed for electrically connecting to later-formed connectors, for example. In some embodiments, the dielectric layer 112b is formed by, but not limited to, forming a blanket layer of dielectric material over the illustrated top surfaces of the conductive layer 116a and the dielectric layer 112a, and patterning the dielectric material blanket layer to form the dielectric layer 112b with a plurality of openings O1 exposing portions of the conductive layer 116a underneath thereto. The patterning may include a dry etching, a wet etching, or a combination thereof. The formation and material of the dielectric layer 112b may be the same or similar to the process and material of forming the dielectric layer 112a as described in FIG. 1, and thus are not repeated therein for brevity. In one embodiment, the material of the dielectric layer 112b is the same as the material of the dielectric layer 112a. In an alternative embodiment, the material of the dielectric layer 112b is different from the material of the dielectric layer 112a; the disclosure is not limited thereto.

After the formation of the dielectric layer 112b, the seed layer 114b is disposed on (e.g., in physical contact with) the dielectric layer 112b and extends into openings O1 formed in the dielectric layer 112b to physically contact the conductive layer 116a exposed by the openings O1, in some embodiments. In other words, the seed layer 114b penetrates through the dielectric layer 112b, and sidewalls of the openings O1 are completely covered by (e.g., lined with) the seed layer 114b. As shown in FIG. 3, the seed layer 114b is physically connected to and electrically connected to the conductive layer 116a, and is electrically coupled to the seed layer 114a through the conductive layer 116a, for example. The seed layer 114b may include a plurality of conductive patterns/segments (not labeled, which are separated from one another) disposed on the dielectric layer 112b, where portions of the dielectric layer 112b are not covered by the seed layer 114b. The formation and material of the seed layer 114b may be the same or similar to the process and material of forming the seed layer 114a as described in FIG. 1 thorough FIG. 2, and thus are not repeated therein for brevity. In one embodiment, the material of the seed layer 114b is the same as the material of the seed layer 114a. In an alternative embodiment, the material of the seed layer 114b is different from the material of the seed layer 114a; the disclosure is not limited thereto.

In some embodiments, the conductive layer 116b is disposed on (e.g., in physical contact with) the seed layer 114b and over the dielectric layer 112b. As shown in FIG. 3, the seed layer 114b may be disposed between the dielectric layer 112b and the conductive layer 116b and between the conductive layers 116a and 116b. In some embodiments, the conductive layer 116b is overlapped with the seed layer 114b in the vertical projection on the dielectric layer 112a along the direction Z. That is to say, a sidewall of the seed layer 114b is substantially aligned with a sidewall of the conductive layer 116b. In the case, the conductive layer 116b and the seed layer 114b share the same geometrical shape on the top view, e.g., the X-Y plane. As shown in FIG. 3, the conductive layer 116b may include a plurality of conductive patterns/segments (not labeled, which are separated from one another) disposed on the seed layer 114b. In some embodiments, as shown in FIG. 3, the conductive layer 116b is physically connected to and electrically connected to the seed layer 114b respectively underlying thereto. In some embodiments, the conductive layer 116b and the seed layer 114b together are referred to as a metallization layer ML2 (or a redistribution layer/line) of the redistribution circuit structure 110. In some embodiments, the dielectric layer 112b and the metallization layer ML2 (including the seed layer 114b and the conductive layer 116b) are referred to as a second build-up layer of the redistribution circuit structure 110.

For example, as shown in FIG. 3, the conductive layer 116b is electrically coupled to the conductive layer 116a through the seed layer 114b. In the case, the conductive layer 116b is electrically coupled to the seed layer 114a through the seed layer 114b and the conductive layer 116a. The formation and material of the conductive layer 116b may be the same or similar to the process and material of forming the conductive layer 116a as described in FIG. 1, and thus are not repeated therein for brevity. In one embodiment, the material of the conductive layer 116b is the same as the material of the conductive layer 116a. In an alternative embodiment, the material of the conductive layer 116b is different from the material of the conductive layer 116a; the disclosure is not limited thereto.

Continued on FIG. 3, the dielectric material layer 118m is disposed on (e.g., in physical contact with) the second build-up layer of the redistribution circuit structure 110, and covers an illustrated top surface of the conductive layer 116b, the illustrated top surface of the dielectric layer 112b exposing by the conductive layer 116b, and the sidewalls of the conductive layer 116b and the seed layer 114b. The dielectric layer 112b, the seed layer 114b, and the conductive layer 116b may not be accessibly revealed by the dielectric material layer 118m, as shown in FIG. 3. In some embodiments, a surface TS118m of the dielectric material layer 118m is considered as a non-planar surface, which adopts an overall topography of the underlying elements (such as the dielectric layer 112b, the seed layer 114b, and the conductive layer 116b). For example, as shown in FIG. 3, a surface roughness R1 of the surface TS118m, which is a difference between a surface peak to a surface valley along the direction Z, is greater than or substantially equal to 4 μm. In one embodiment, the surface roughness R1 is ranging about 4 μm to about 7 μm. In an alternative embodiment, the surface roughness R1 is ranging about 4 μm to about 5 μm.

The formation of the dielectric material layer 118m may include, but not limited to, conformally forming a blanket of a dielectric material over the second build-up layer of the redistribution circuit structure 110 to completely cover the metallization layer ML2 and the dielectric layer 112b exposed by the metallization layer ML2. The material of the dielectric material layer 118m may be PI, PBO, BCB, a nitride such as silicon nitride, an oxide such as silicon oxide, PSG, BSG, BPSG, a combination thereof, or the like. In some embodiments, the dielectric material blanket layer is formed by suitable fabrication techniques such as spin-on coating, CVD, (e.g., PECVD), or the like. In one embodiment, the material of the dielectric material layer 118m is the same as the material of the dielectric layer 112a and/or 112b. For example, the dielectric material layer 118m is made of PI, while at least one of the dielectric layers 112a and 112b is also made of PI. In an alternative embodiment, the material of the dielectric material layer 118m is different from the material of the dielectric layer 112a and/or 112b; the disclosure is not limited thereto. Upon this, the dielectric layers 112a, 112b and 118m and the metallization layer ML1 (including 114a and 116a) and ML2 (including 114b and 116b) are alternately formed, for example, on the release layer 104 and over the carrier substrate 102, in accordance with step S11a of FIG. 17.

Figure 4:
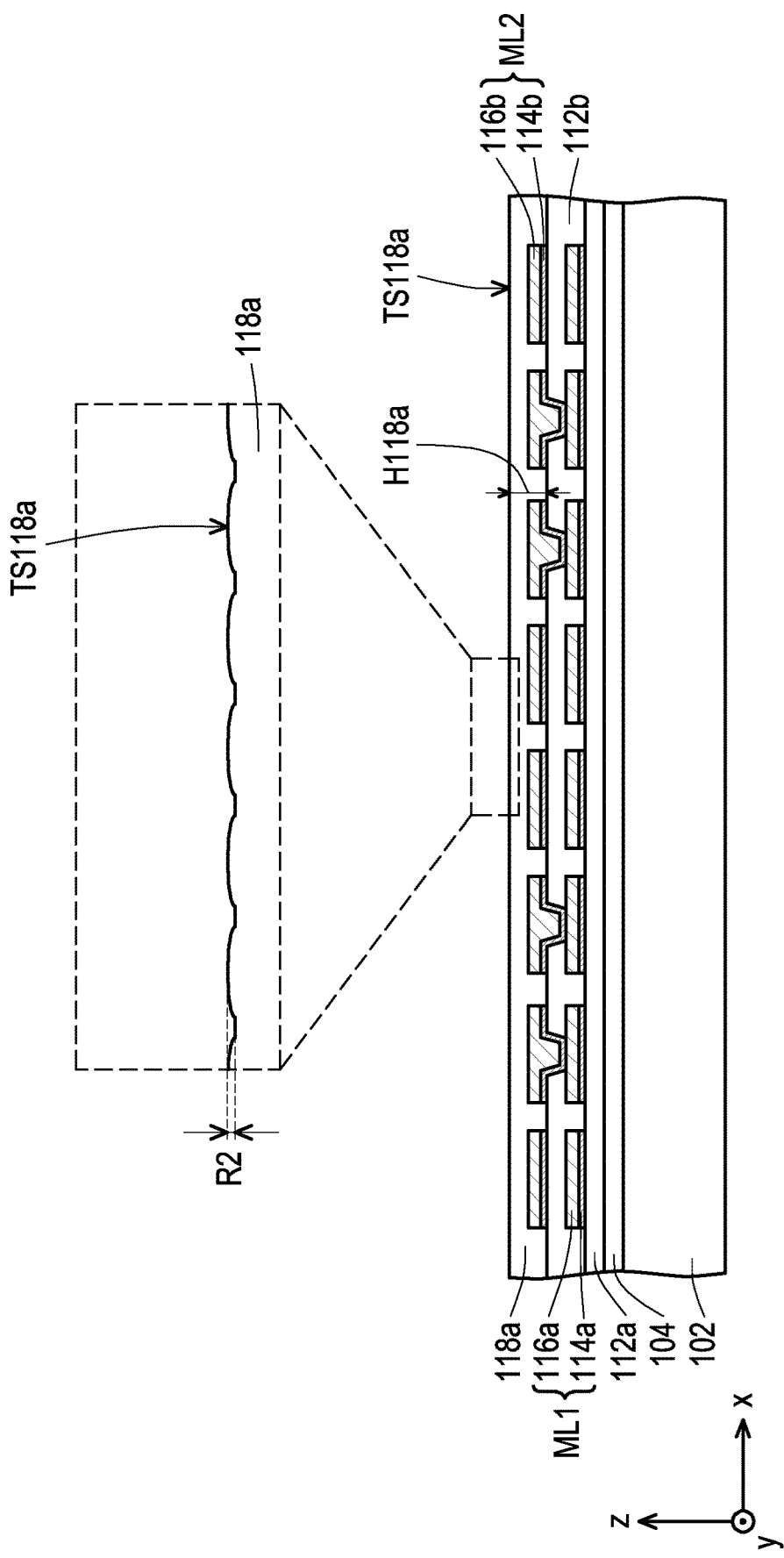

Referring to FIG. 4, in some embodiments, the dielectric material layer 118m is planarized to form a dielectric layer 118a, in accordance with step S12a of FIG. 17. For example, the dielectric layer 118a is disposed on (e.g., in physical contact with) the conductive layer 116b, the seed layer 114b, and the dielectric layer 112b exposed by the conductive layer 116b and the seed layer 114b. In some embodiments, a surface TS118a of the dielectric layer 118a is considered as a substantially planar surface, which has a surface roughness R2 (e.g., a difference between a surface peak to a surface valley along the direction Z) being less than or substantially equal to 2 μm. In one embodiment, the surface roughness R2 is ranging about 0.5 μm to about 2 μm. In an alternative embodiment, the surface roughness R2 is ranging about 1 μm to about 2 μm. In the disclosure, the surface roughness R2 is in an acceptable tolerance, for example, less than or substantially equal to 2 μm. As the surface roughness R2 falls within the acceptable tolerance, the surface TS118a of the dielectric layer 118a is substantially flat and planar. As shown in FIG. 4, the surface TS118a of the dielectric layer 118a, for example, provides a high degree of coplanarity and flatness. Due to the high degree of coplanarity and flatness in the surface TS118a of the dielectric layer 118a, the formation of the later-formed layer(s) and/or element(s) is beneficial, such as a process window of a pick-and-place process for a semiconductor die is enlarged.

In some embodiments, the dielectric material layer 118m is planarized by a mechanical grinding process, a chemical mechanical polishing (CMP) process, an etching process, or combinations thereof. The etching process may include a dry etching, a wet etching, or a combination thereof. After the planarizing process, a cleaning process may be optionally performed, for example to clean and remove the residue generated from the planarizing process. However, the disclosure is not limited thereto, and the planarizing process may be performed through any other suitable method. As shown in FIG. 4, for example, the dielectric layer 118a has a thickness H118a ranging from about 2 μm to about 30 μm.

Figure 5:
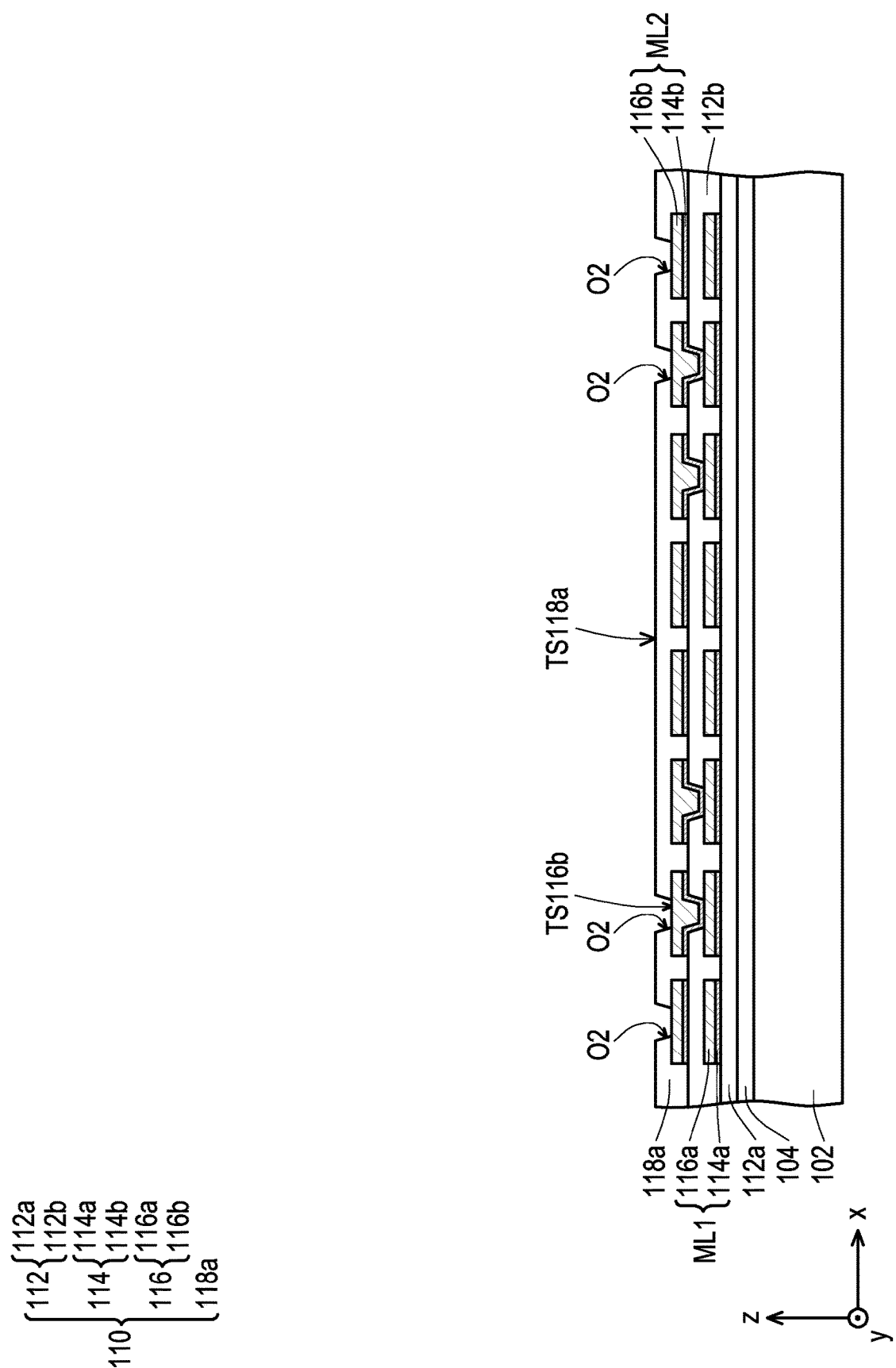

Referring to FIG. 5, in some embodiments, the dielectric layer 118a is patterned to include a plurality of openings O2 each exposing a portion of the conductive layer 116b, in accordance with step S13a of FIG. 17. For example, through the openings O2, a surface TS116b of the conductive layer 116b is partially exposed for electrically connecting to later-formed connectors, for example. The patterning may include a dry etching, a wet etching, or a combination thereof. As shown in FIG. 5, the surface TS116b of the conductive layer 116b is lower than the surface TS118a of the dielectric layer 118a, in the direction Z, for example. In other words, the illustrated top surface (e.g., the surface TS116b) of the conductive layer 116b is partially covered by the dielectric layer 118a, and the illustrated top surface of the dielectric layer 112b exposed by the conductive layer 116b and the seed layer 114b and the sidewalls of the seed layer 114b are completely covered by the dielectric layer 118a. The dielectric layer 118a may be referred to as a thinned dielectric layer or a capping layer of the redistribution circuit structure 110.

In some embodiments, the dielectric layers 112a, 112b and 118a are together referred to as a dielectric structure of the redistribution circuit structure 110, the metallization layers ML1 and ML2 are together referred to as a routing structure of the redistribution circuit structure 110. If considering the dielectric layers 112a, 112b and 118a are made of the same material, there is no clear interface between any two adjacent layers of the dielectric layers 112a, 112b and 118a. On the other hand, if considering any two adjacent layers of the dielectric layers 112a, 112b and 118a are made of different materials, there is a clear interface between the two adjacent layers of the dielectric layers 112a, 112b and 118a.

Up to here, the redistribution circuit structure 110 is manufactured. For example, the first build-up layer and the second build-up layer are electrically connected to one another. Although only one first build-up layer and one second build-up layer are included in the redistribution circuit structure 110 as shown in FIG. 5 for illustrative purposes, the number of each of the first and second build-up layers may not be limited to what is depicted in FIG. 5. For example, the number of each of the first and second build-up layers may be one or more than one. The disclosure is not limited thereto.

Figure 6:
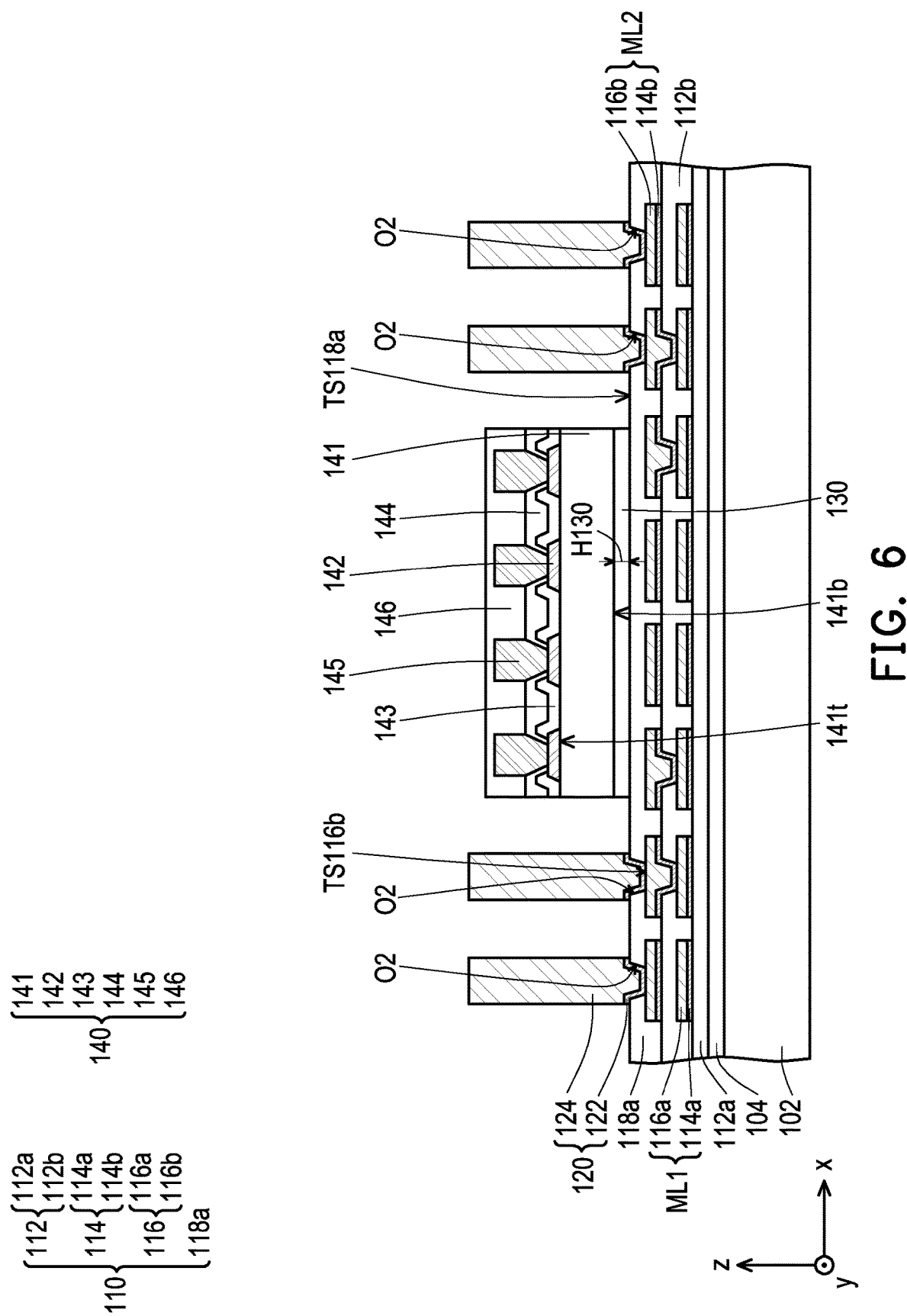

Referring to FIG. 6, in some embodiments, at least one conductive pillar 120 and at least one semiconductor die 140 are formed on the redistribution circuit structure 110 and over the carrier substrate 102. For illustrative purposes, the at least one conductive pillar 120 includes a plurality of conductive pillars 120 (e.g., four conductive pillars 120), and at least one semiconductor die 140 includes one semiconductor die 140, as presented in FIG. 6. However, the number of the conductive pillars 120 and the number of the semiconductor die 140 are not limited to what is depicted in the disclosure, and may be selected and designated based on the demand and design requirements. The number of the conductive pillars 120 may be more than or less than four, and the number of the semiconductor die 140 may be more than one. For example, the number of the conductive pillars 120 can be adjusted by changing the number of the openings O2 formed in the dielectric layer 118a. In some embodiments, the conductive pillars 120 and the semiconductor die 140 are arranged side-by-side on a side (e.g., the surface TS118a) of the redistribution circuit structure 110.

In some embodiments, the conductive pillars 120 are disposed on the redistribution circuit structure 110 and extend into the openings O2 to physically connect to and electrically connect to the metallization layer ML2 of the redistribution circuit structure 110, in accordance with step S20 of FIG. 16. As shown in FIG. 6, the conductive pillars 120 are in physical contact with the conductive layer 116b through the openings O2 formed in the dielectric layer 118a, for example. In some embodiments, the conductive pillars 120 each include a seed pattern 122 and a conductive via 124 standing thereon. As shown in FIG. 6, the seed patterns 122 may be disposed on the surface TS118a of the dielectric layer 118a and further extended into the openings O2, and the conductive vias 124 may be respectively disposed on (e.g., in physical contact with) the seed patterns 122. In the case, the seed patterns 122 penetrate through the dielectric layer 118a, and sidewalls of the openings O2 are completely covered by (e.g., lined with) the seed patterns 122. In other words, the conductive pillars 120 penetrate through the dielectric layer 118a, where the conductive vias 124 are electrically coupled to the conductive layer 116b through the seed patterns 122.

The formation and material of the seed patterns 122 may be the same or similar to the process and material of forming the seed layer 114a as described in FIG. 1 through FIG. 2, and the formation and material of the conductive vias 124 may be the same or similar to the process and material of forming the conductive layer 116a as described in FIG. 1; thus, are not repeated therein for brevity. In some embodiments, a material of the conductive vias 124 may include a metal material such as copper or copper alloys, or the like. As shown in FIG. 6, for example, in the vertical projection on the dielectric layer 112a along the direction Z, the conductive vias 124 are completely overlapped with the seed patterns 122. That is to say, a sidewall of one conductive via 124 may be substantially aligned with a sidewall of a respective one seed pattern 122. For example, one conductive via 124 and the respective one seed pattern 122 share the same geometrical shape on the top view, e.g., the X-Y plane. In some embodiments, the conductive pillars 120 may be through integrated fan-out (InFO) vias, vertical connectors, or vertical connections. In some embodiments, the conductive pillars 120 are arranged along but not on a cutting line (not shown) between two package structures (e.g., two of the package structures 100a).

Continued on FIG. 6, in some embodiments, the semiconductor die 140 is disposed on the redistribution circuit structure 110 and next to the conductive pillars 120, in accordance with step S30 of FIG. 16. In some embodiments, the semiconductor die 140 is picked and placed over the redistribution circuit structure 110 and disposed on the surface TS118a of the dielectric layer 118a, where the semiconductor die 140 is laterally distant from the conductive pillars 120. In some embodiments, the semiconductor die 140 includes a semiconductor substrate 141 having an active surface 141t and a backside surface 141b opposite to the active surface 141t, a plurality of pads 142 distributed on the active surface 141t, a passivation layer 143 covering the active surface 141t and a portion of the pads 142, a post passivation layer 144 covering the passivation layer 143 and a portion of the pads 142, a plurality of conductive vias 145 connecting to the pads 142 exposing by the passivation layer 143 and the post passivation layer 144, and a protection layer 146 disposed on and covering the post passivation layer 144 and the conductive vias 145. The pads 142, the passivation layer 143, the post passivation layer 144, the conductive vias 145, and the protection layer 146 may be formed on the semiconductor substrate 141. In some embodiments, the pads 142 are partially exposed by the passivation layer 143 and the post passivation layer 144, the conductive vias 145 are respectively disposed on and electrically connected to the pads 142, and the protection layer 146 covers the post passivation layer 144 exposed by the conductive vias 145 and illustrated top surfaces (not labeled) of the conductive vias 145 for providing protection, which avoids the conductive vias 145 of the semiconductor die 140 are damaged during the transportation process or the pick-and-place process.

However, the disclosure may not be limited thereto. Alternatively, the illustrated top surfaces of the conductive vias 145 may be accessibly exposed by the protection layer 146. Or alternatively, the post passivation layer 144 and/or the protection layer 146 may be omitted.

In other embodiments, the conductive vias 145 and the protection layer 146 are omitted. For example, the semiconductor die 140 includes the semiconductor substrate 141 having the active surface 141t and the backside surface 141b opposite to the active surface 141t, the plurality of pads 142 distributed on the active surface 141t, the passivation layer 143 covering the active surface 141t and a portion of the pads 142, and the post passivation layer 144 covering the passivation layer 143 and a portion of the pads 142. Alternatively, the post passivation layer 144 may be omitted.

The material of the semiconductor substrate 141 may include a silicon substrate including active components (e.g., transistors, memories (such as N-type metal-oxide semiconductor (NMOS), P-type metal-oxide semiconductor (PMOS) devices, a combination thereof, or the like), a combination thereof, or the like) and/or passive components (e.g., resistors, capacitors, inductors, combinations thereof, or the like) formed therein or thereon. In some embodiments, such active components and passive components are formed in a front-end-of-line (FEOL) process. The semiconductor substrate 141 may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant, or a combination thereof. The disclosure is not limited thereto.

Furthermore, the semiconductor substrate 141 may further include an interconnection structure or interconnect (not shown) disposed on the active surface 141t. The interconnection structure may include one or more inter-dielectric layers and one or more patterned conductive layers stacked alternately for providing routing function to the active components and the passive components embedded in or formed on the semiconductor substrate 141, where the pads 142 may be referred to as an outermost layer of the patterned conductive layers of the interconnection structure. In some embodiment, the interconnection structure is formed in a back-end-of-line (BEOL) process. The inter-dielectric layers may be silicon oxide layers, silicon nitride layers, silicon oxy-nitride layers, or dielectric layers formed by other suitable dielectric materials, and the inter-dielectric layers may be formed by deposition or the like. The patterned conductive layers may be patterned copper layers or other suitable patterned metal layers, and the patterned conductive layers may be formed by electroplating or deposition. However, the disclosure is not limited thereto.

The pads 142 are aluminum pads or other suitable metal pads, for example. The conductive vias 145 are copper pillars, copper alloy pillar or other suitable metal pillars containing copper metal, for example. In some embodiments, the passivation layer 143, the post passivation layer 144, and the protection layer 146 may be a PBO layer, a PI layer, or other suitable polymers. In some alternative embodiments, the passivation layer 143, the post passivation layer 144, and the protection layer 146 may be made of inorganic materials, such as silicon oxide, silicon nitride, silicon oxynitride, or any suitable dielectric material. The material of the passivation layer 143, the material of the passivation layer 143, and the material of the protection layer 146 may be the same. Alternatively, the material of the passivation layer 143, the material of the passivation layer 143, and the material of the protection layer 146 may be different, in part or all. For example, the passivation layer 143 and the protection layer 146 independently are a silicon oxide layer, a silicon nitride layer, a silicon oxy-nitride layer, or a dielectric layer formed by other suitable dielectric materials, and the post-passivation layer 144 is a PI layer, a PBO layer, or a dielectric layer formed by other suitable polymers.

It is noted that, the semiconductor die 140 described herein is referred as a semiconductor chip or an integrated circuit (IC), for example. In an alternative embodiment, the semiconductor die 140 described herein may be a semiconductor device. In some embodiments, the semiconductor die 140 includes a digital chip, an analog chip, or a mixed signal chip. In some embodiments, the semiconductor die 140 is a logic die such as a central processing unit (CPU), a graphics processing unit (GPU), a neural network processing unit (NPU), a deep learning processing unit (DPU), a tensor processing unit (TPU), a system-on-a-chip (SoC), an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA); a combination thereof; or the like. In alternative embodiments, the semiconductor die 140 is a memory die with a controller or without a controller, where the memory die includes a single-form die such as a dynamic random access memory (DRAM) die, a static random access memory (SRAM) die, a resistive random-access memory (RRAM) die, a magnetoresistive random-access memory (MRAM) die, a NAND flash memory, a wide I/O memory (WIO); a pre-stacked memory cube such as a hybrid memory cube (HMC) module, a high bandwidth memory (HBM) module; a combination thereof; or the like. In further alternative embodiments, the semiconductor die 140 is an artificial intelligence (AI) engine such as an AI accelerator; a computing system such as an AI server, a high-performance computing (HPC) system, a high-power computing device, a cloud computing system, a networking system, an edge computing system, an immersive memory computing system (ImMC), a system-on-integrated-circuit (SoIC) system, etc.; a combination thereof; or the like. In some other embodiments, the semiconductor die 140 is an electrical and/or optical input/output (I/O) interface die, an integrated passives die (IPD), a voltage regulator (VR) die, a local silicon interconnect (LSI) die with or without deep trench capacitor (DTC) features, a LSI die with multi-tier functions such as electrical and/or optical network circuit interfaces, IPD, VR, DTC, or the like. Alternatively, the semiconductor die 140 may be referred to as a chip or an IC of combination-type, such as a WiFi chip simultaneously including both of a RF chip and a digital chip. The type of the semiconductor die 140 may be selected and designated based on the demand and design requirements, and thus is not specifically limited in the disclosure.

In certain embodiments, additional semiconductor die(s) of the same type or different types may be included. The additional semiconductor die(s) may include digital chips, analog chips, or mixed signal chips, such as ASIC chips, sensor chips, wireless and RF chips, memory chips, logic chips, voltage regulator chips, or the like. The disclosure is not limited thereto. It should be appreciated that the illustration of the semiconductor die 140 and its components throughout all figures is schematic and is not in scale.

As illustrated in FIG. 6, in some embodiments, the semiconductor die 140 is bonded to the redistribution circuit structure 110 by adhering onto the redistribution circuit structure 110 with a connecting film 130. The semiconductor die 140 (e.g., the backside surface 141b thereof) may be adhered to the surface TS118a of the dielectric layer 118a of the redistribution circuit structure 110 by the connecting film 130. For example, as shown in FIG. 6, the connecting film 130 is sandwiched between the semiconductor die 140 and the redistribution circuit structure 110. Owing to the connecting film 130, the semiconductor die 140 is stably adhered to the dielectric layer 118a of the redistribution circuit structure 110. Owing to the dielectric layer 118a (having the surface TS118a with high degree of coplanarity and flatness), there is no or little air or void trapped between the connecting film 130 and the redistribution circuit structure 110, thereby an undesired movement of the semiconductor die 140 and/or an insulating encapsulation 150 (see FIG. 7 through FIG. 8) surrounding the semiconductor die 140 and/or the moisture trapped by the void and/or the risk of "pop-corn" may be suppressed, which enhancing the reliability and performance of the package structure 100a.

In some embodiments, the connecting film 130 includes a thermally conductive die attach film, which is a layer made of adhesives (for example, a polymer-based adhesive such as example, epoxy-based resin, silicon-based resin, rubber-based resin, acrylic polymer, or the like), other suitable insulating material, or the like, with thermally conductive fillers filled therein. In some embodiments, a material of the thermally conductive fillers includes metal or metal alloy. In alternative embodiments, the material of the thermally conductive fillers includes boron nitride or the like. In the case, an amount of the thermally conductive filler (by weight percentage) presented in the thermally conductive die attach film is ranging from about 40% to about 95%, such as from about 50% to about 80%. Alternatively, the connecting film 130 includes a thermally conductive die attach film, which is a layer made of graphite, graphene, or the like. In some embodiments, if considering the connecting film 130 is a thermally conductive die attach film, the connecting film 130 has a thermal conductivity being about 0.5 W/(m·K) to about 50 W/(m·K), such as about 2 W/(m·K). However, the disclosure is not limited thereto.

In other embodiments, the connecting film 130 includes a non-thermally conductive die attach film, which is a layer made of adhesives (for example, a polymer-based adhesive such as example, epoxy-based resin, silicon-based resin, rubber-based resin, acrylic polymer, or the like), other suitable insulating material, or the like. In the case, the non-thermally conductive die attach film may be with or without non-thermally conductive fillers filled therein. In some embodiments, the non-thermally conductive fillers include silica, alumina, or the like. In the embodiments of which the non-thermally conductive die attach film includes the non-thermally conductive fillers, an amount of the non-thermally conductive filler (by weight percentage) presented in the non-thermally conductive die attach film is ranging from about 5% to about 50%. In some embodiments, if considering the connecting film 130 is a non-thermally conductive die attach film, the connecting film 130 has a thermal conductivity less than about 0.2 W/(m·K).

In some embodiments, a thickness H130 of the connecting film 130 is ranging from about 5 μm to about 200 μm. In the embodiments of which the connecting film 130 is the thermally conductive die attach film, the connecting film 130 thermally couples the semiconductor die 140 and the redistribution circuit structure 110, which helps to dissipate heat from the semiconductor die 140; thus, the thickness H130 of the connecting film 130 can be thick to ensure a high surface coverage capability. In the embodiments of which the connecting film 130 is the non-thermally conductive die attach film, in order to allow the connecting film 130 being capable of thermally coupling the semiconductor die 140 and the redistribution circuit structure 110 for the heat dissipation of the semiconductor die 140, the thickness H130 of the connecting film 130 can be thin. In other words, the heat dissipation of the package structure 100a may be controlled (e.g., to be improved or maintained based on the demand and design requirements) by adjusting the thermal conductivity and/or the thickness H130 of the connecting film 130, for example, in the disclosure.

In FIG. 6, for example, the semiconductor die 140 and the conductive pillars 120 are arranged next to each other along the X-Y plane. In some embodiments, the semiconductor die 140 are not overlapped with the conductive pillars 120 in the direction Z, but are overlapped with each other in the direction X and/or the direction Y. In one embodiment, a height of the conductive pillars 120 is greater than a height of the semiconductor die 140, as shown in FIG. 6. Alternatively, the height of the conductive pillars 120 may be less than or substantially equal to the height of the semiconductor die 140.

Figure 7:
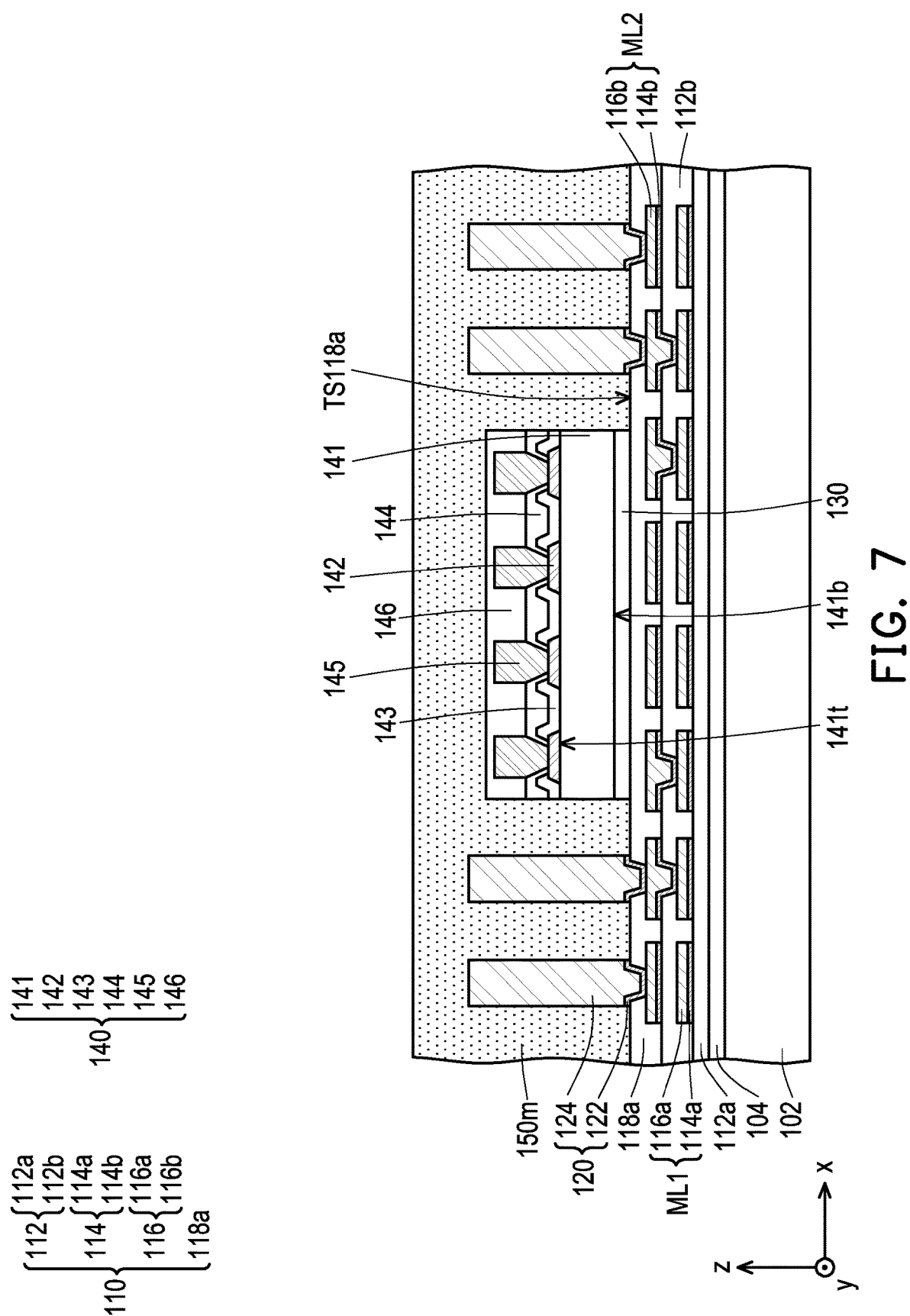

Referring to FIG. 7, in some embodiments, an encapsulation material 150m is formed on the redistribution circuit structure 110 to encapsulate the conductive pillars 120 and the semiconductor die 140, in accordance with step S40 of FIG. 16. The conductive pillars 120 and the semiconductor die 140 are embedded in the encapsulation material 150m, and the redistribution circuit structure 110 exposed by the conductive pillars 120 and the semiconductor die 140 is covered by the encapsulation material 150m, for example. In other words, the conductive pillars 120 and the protection layer 146 of the semiconductor die 140 may be not accessibly revealed and are well-protected by the encapsulation material 150*m*. In some embodiments, the encapsulation material 150*m* is a molding compound, a molding underfill, a resin (such as epoxy-based resin), or the like. The encapsulation material 150*m* may be formed by a molding process, such as a compression molding process or a transfer molding process. In some embodiments, the encapsulation material 150*m* may further include inorganic filler or inorganic compound (e.g., silica, clay, and so on) which can be added therein to optimize coefficient of thermal expansion (CTE) of the encapsulation material 150*m*. The disclosure is not limited thereto.

Figure 8:
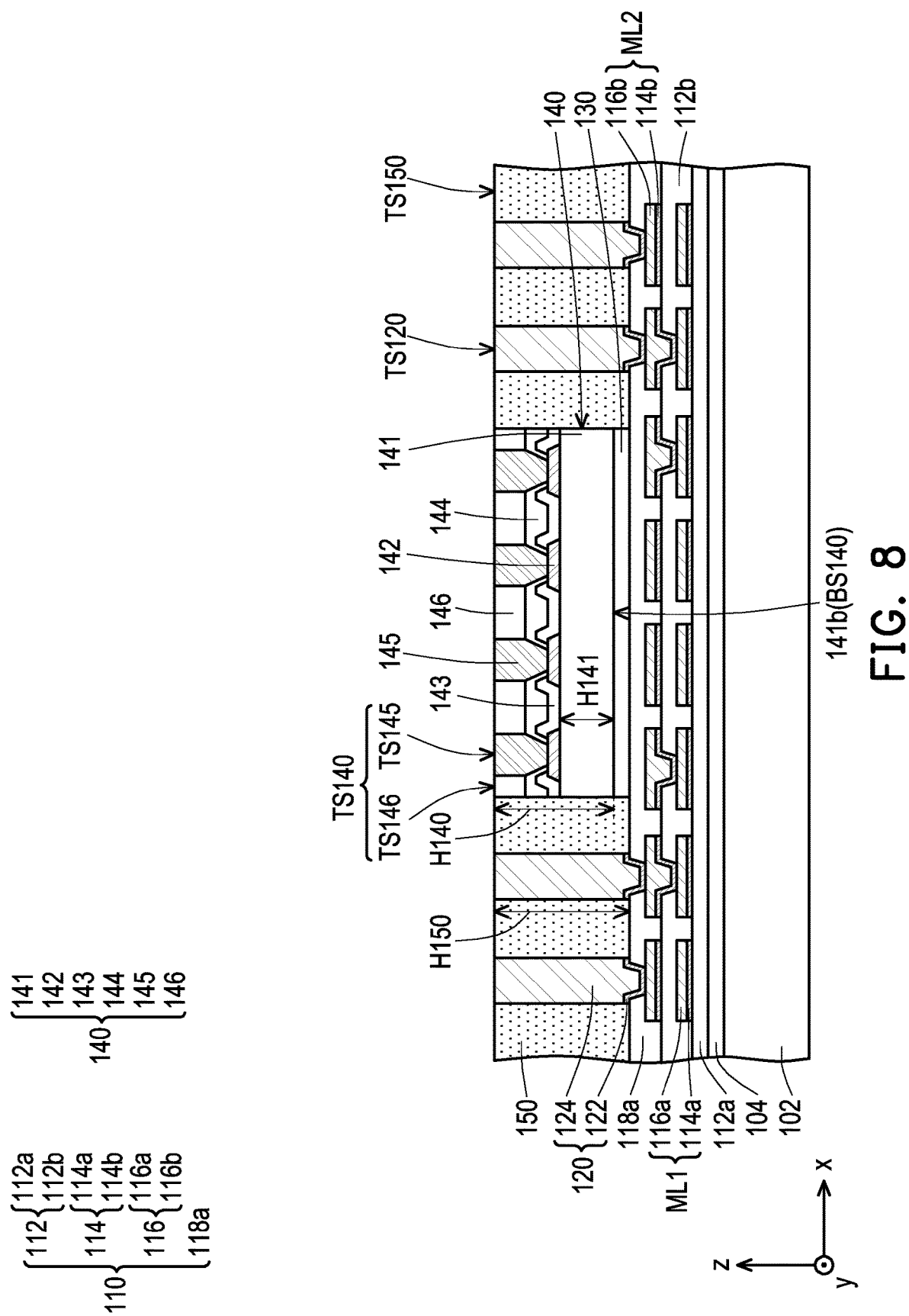

Referring to FIG. 7 and FIG. 8, in some embodiments, the encapsulation material 150*m* are planarized to form an insulating encapsulation 150 exposing the conductive pillars 120 and the semiconductor die 140, in accordance with step S40 of FIG. 16. The insulating encapsulation 150 is disposed over the redistribution circuit structure 110 to laterally encapsulate the semiconductor die 140 and the conductive pillars 120, for example, as shown in FIG. 8. In some embodiments, the encapsulation material 150*m* is planarized by a mechanical grinding process and/or a CMP process. In some embodiments, during the planarizing process of the encapsulation material 150*m*, the protection layer 146 is planarized to accessibly reveal the conductive vias 145. In some embodiments, portions of the conductive vias 145 and portions of the conductive pillars 120 are slightly planarized as well. As shown in FIG. 8, a surface TS150 of the insulating encapsulation 150 is substantially leveled with surfaces TS145 of the conductive vias 145 and a surface TS146 of the protection layer 146 of the semiconductor die 140 and surfaces TS120 of the conductive pillars 120, for example. In some embodiments, the surface TS150 of the insulating encapsulation 150, the surfaces TS120 of the conductive pillars 120, and the surfaces TS145 of the conductive vias 145 and the surface TS146 of the protection layer 146 of the semiconductor die 140 are substantially coplanar to each other. The surfaces TS145 of the conductive vias 145 and the surface TS146 of the protection layer 146 together may be referred to as a front side (or an active side) TS140 of the semiconductor die 140, and the backside surface 141*b* may be referred to as a rear side (or a non-active side) BS140 of the semiconductor die 140. For example, in direction Z, the front side TS140 of the semiconductor die 140 is opposite to the rear side BS140 of the semiconductor die 140.

In some embodiments, the exposed portion of the conductive vias 145 is located on the front side TS140 of the semiconductor die 140, and the connecting film 130 is located on the rear side BS140 of the semiconductor die 140. The insulating encapsulation 150 encapsulates sidewalls of the semiconductor die 140 and sidewalls of the conductive pillars 120, and the insulating encapsulation 150 is penetrated by the conductive pillars 120. In some embodiments, after the planarizing process, a cleaning step may be optionally performed to clean and remove the residue generated from the planarizing process. As show in FIG. 8, a thickness H150 of the insulating encapsulation 150 is substantially equal to a sum of the thickness H130 of the connecting film 130 and a thickness H140 of the semiconductor die 140, for example. In the case, sidewalls of the connecting film 130 is completely covered (e.g., in physical contact with) the insulating encapsulation 150.

Figure 9:
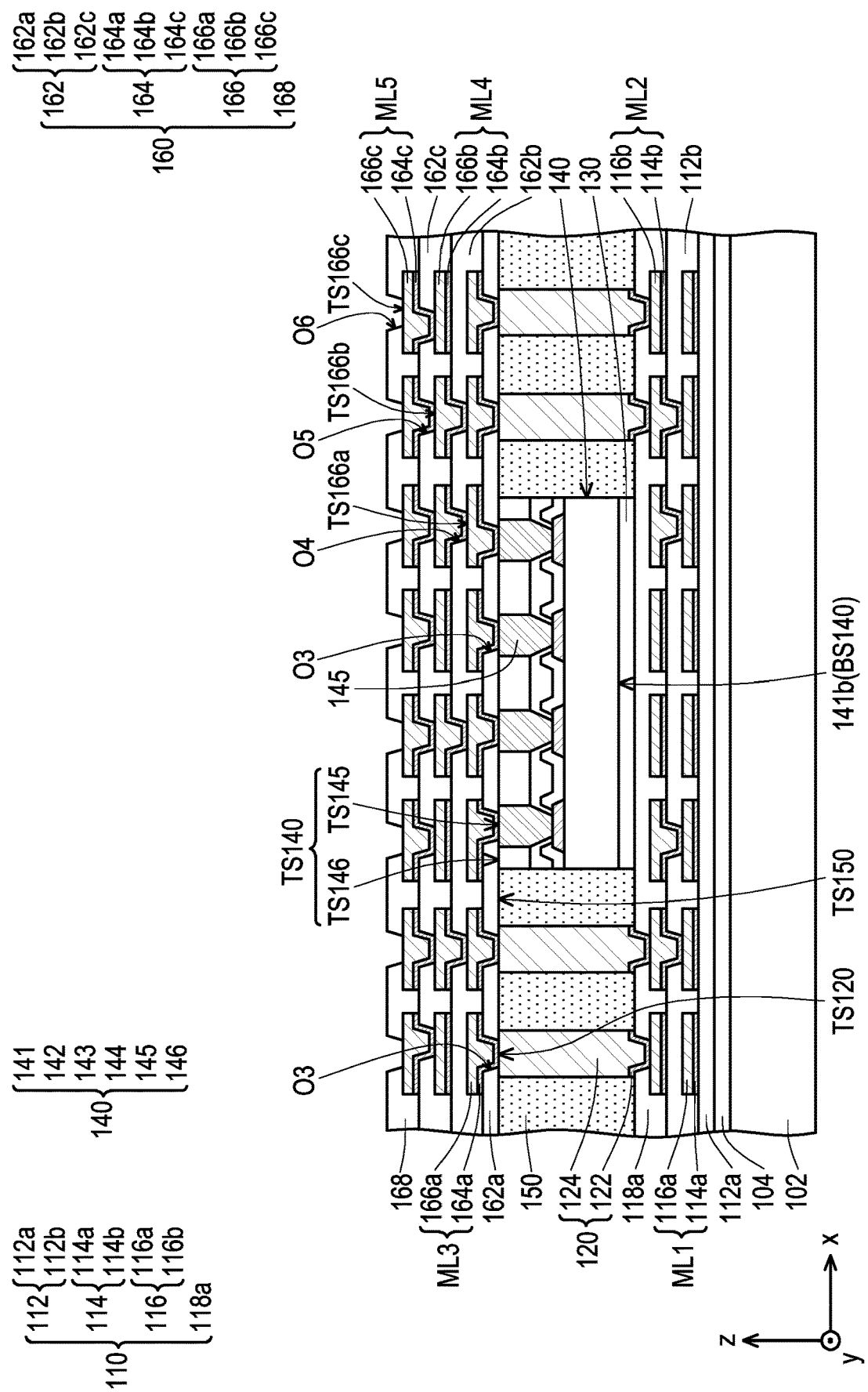

Referring to FIG. 9, in some embodiments, a redistribution circuit structure 160 is formed on the insulating encapsulation 150, the semiconductor die 140, and the conductive pillars 120, in accordance with step S50 of FIG. 16. In some embodiments, the redistribution circuit structure 160 includes at least one dielectric layer 162 (e.g., 162*a*, 162*b*, and 162*c*), at least one seed layer 164 (e.g., 164*a*, 164*b*, and 164*c*), at least one conductive layer 166 (e.g., 166*a*, 166*b*, and 166*c*), and a dielectric layer 168. However, in the disclosure, the numbers of layers of the dielectric layer 162, the seed layer 164, and the conductive layer 166 are not limited to what is depicted in FIG. 9, where the numbers of the layers of the dielectric layer 162, the seed layer 164, and the conductive layer 166 may be one or more than one depending upon the demand and design requirements. In some embodiments, one conductive layer 166 includes a line portion extending along a horizontal direction (e.g., the direction X or the direction Y), a via portion extending along a vertical direction (e.g., the direction Z) connecting to the line portion, or a combination thereof.

In some embodiments, a dielectric layer 162*a*, a seed layer 164*a*, and a conductive layer 166*a* are sequentially formed over the insulating encapsulation 150. As shown in FIG. 9, for example, the dielectric layer 162*a* is disposed on (e.g., in physical contact with) the insulating encapsulation 150, the semiconductor die 140, and the conductive pillars 120. In some embodiments, the dielectric layer 162*a* has a plurality of openings O3 each exposing portions of the conductive pillars 120 and portions of the conductive vias 145 of the semiconductor die 140. As show in FIG. 9, through the openings O3, the surfaces TS120 of the conductive pillars 120 and the surfaces TS145 of the conductive vias 145 are partially exposed for electrically connecting to later-formed connectors, for example.

In some embodiments, the seed layer 164*a* is disposed on (e.g., in physical contact with) the dielectric layer 162*a* and extends into openings O3 formed in the dielectric layer 162*a* to physically contact the conductive pillars 120 and the conductive vias 145 exposed by the openings O3. In other words, the seed layer 164*a* penetrates through the dielectric layer 162*a*, and sidewalls of the openings O3 are completely covered by (e.g., lined with) the seed layer 164*a*. As shown in FIG. 9, the seed layer 164*a* is physically connected to and electrically connected to the conductive pillars 120 and the conductive vias 145, and is electrically coupled to the redistribution circuit structure 110 through the conductive pillars 120 and electrically coupled to the semiconductor die 140 through the conductive vias 145, for example. The seed layer 164*a* may include a plurality of conductive patterns/segments (not labeled, which are separated from one another) disposed on the dielectric layer 162*a*, where portions of the dielectric layer 162*a* are not covered by the seed layer 164*a*, as shown in FIG. 9.

In some embodiments, the conductive layer 166*a* is disposed on (e.g., in physical contact with) the seed layer 164*a* and over the dielectric layer 162*a*. As shown in FIG. 9, the seed layer 164*a* may be disposed between the dielectric layer 162*a* and the conductive layer 166*a*, between the conductive pillars 120 and the conductive layer 166*a*, and between the conductive vias 145 and the conductive layer 166*a*. In some embodiments, the conductive layer 166*a* is overlapped with the seed layer 164*a* in a vertical projection on the dielectric layer 162*a* along the direction Z. That is to say, a sidewall of the seed layer 164*a* is substantially aligned with a sidewall of the conductive layer 166*a*. In the case, the conductive layer 166*a* and the seed layer 164*a* share the same geometrical shape on the top view, e.g., the X-Y plane. As shown in FIG. 9, the conductive layer 166*a* may include a plurality of conductive patterns/segments (not labeled, which are separated from one another) disposed on the seed layer 164*a*. In some embodiments, as shown in FIG. 9, the conductive layer 166*a* is physically connected to and electrically connected to the seed layer 164a respectively underlying thereto. In some embodiments, the conductive layer 166a and the seed layer 164a together are referred to as a metallization layer ML3 (or a redistribution layer/line) of the redistribution circuit structure 160. In some embodiments, the dielectric layer 162a and the metallization layer ML3 (including the seed layer 164a and the conductive layer 166a) are referred to as a first build-up layer of the redistribution circuit structure 160. For example, the conductive layer 166a is electrically coupled to the conductive pillars 120 and the conductive vias 145 through the seed layer 164a. In the case, the conductive layer 166a is electrically coupled to the redistribution circuit structure 110 through the conductive pillars 120 and the seed layer 164a.

Continued on FIG. 9, in some embodiments, a dielectric layer 162b, a seed layer 164b, and a conductive layer 166b are sequentially formed over the first build-up layer of the redistribution circuit structure 160. For example, the dielectric layer 162b is disposed on (e.g., in physical contact with) the metallization layer ML3 and the dielectric layer 162a exposed by the metallization layer ML3. In some embodiments, the dielectric layer 162b has a plurality of openings O4 each exposing portions of the conductive layer 166a. As show in FIG. 9, through the openings O4, a surface TS166a of the conductive layer 166a is partially exposed for electrically connecting to later-formed connectors, for example.

In some embodiments, the seed layer 164b is disposed on (e.g., in physical contact with) the dielectric layer 162b and extends into openings O4 formed in the dielectric layer 162b to physically contact the conductive layer 166a exposed by the openings O4. In other words, the seed layer 164b penetrates through the dielectric layer 162b, and sidewalls of the openings O4 are completely covered by (e.g., lined with) the seed layer 164b. As shown in FIG. 9, the seed layer 164b is physically connected to and electrically connected to the conductive layer 166a, and is electrically coupled to the seed layer 164a through the conductive layer 166a, for example. The seed layer 164b may include a plurality of conductive patterns/segments (not labeled, which are separated from one another) disposed on the dielectric layer 162b, where portions of the dielectric layer 162b are not covered by the seed layer 164b, as shown in FIG. 9.

In some embodiments, the conductive layer 166b is disposed on (e.g., in physical contact with) the seed layer 164b and over the dielectric layer 162b. As shown in FIG. 9, the seed layer 164b may be disposed between the dielectric layer 162b and the conductive layer 166b and between the conductive layers 166a and 166b. In some embodiments, the conductive layer 166b is overlapped with the seed layer 164b in the vertical projection on the dielectric layer 162a along the direction Z. That is to say, a sidewall of the seed layer 164b is substantially aligned with a sidewall of the conductive layer 166b. In the case, the conductive layer 166b and the seed layer 164b share the same geometrical shape on the top view, e.g., the X-Y plane. As shown in FIG. 9, the conductive layer 166b may include a plurality of conductive patterns/segments (not labeled, which are separated from one another) disposed on the seed layer 164b. In some embodiments, as shown in FIG. 9, the conductive layer 166b is physically connected to and electrically connected to the seed layer 164b respectively underlying thereto. In some embodiments, the conductive layer 166b and the seed layer 164b together are referred to as a metallization layer ML4 (or a redistribution layer/line) of the redistribution circuit structure 160. In some embodiments, the dielectric layer 162b and the metallization layer ML4 (including the seed layer 164b and the conductive layer 166b) are referred to as a second build-up layer of the redistribution circuit structure 160. For example, the conductive layer 166b is electrically coupled to the conductive layer 166a through the seed layer 164b.

Continued on FIG. 9, in some embodiments, a dielectric layer 162c, a seed layer 164c, and a conductive layer 166c are sequentially formed over the second build-up layer of the redistribution circuit structure 160. For example, the dielectric layer 162c is disposed on (e.g., in physical contact with) the metallization layer ML4 and the dielectric layer 162b exposed by the metallization layer ML4. In some embodiments, the dielectric layer 162c has a plurality of openings O5 each exposing portions of the conductive layer 166b. As show in FIG. 9, through the openings O5, a surface TS166b of the conductive layer 166b is partially exposed for electrically connecting to later-formed connectors, for example.

In some embodiments, the seed layer 164c is disposed on (e.g., in physical contact with) the dielectric layer 162c and extends into openings O5 formed in the dielectric layer 162c to physically contact the conductive layer 166b exposed by the openings O5. In other words, the seed layer 164c penetrates through the dielectric layer 162c, and sidewalls of the openings O5 are completely covered by (e.g., lined with) the seed layer 164c. As shown in FIG. 9, the seed layer 164c is physically connected to and electrically connected to the conductive layer 166b, and is electrically coupled to the seed layer 164b through the conductive layer 166b, for example. The seed layer 164c may include a plurality of conductive patterns/segments (not labeled, which are separated from one another) disposed on the dielectric layer 162c, where portions of the dielectric layer 162c are not covered by the seed layer 164c, as shown in FIG. 9.

In some embodiments, the conductive layer 166c is disposed on (e.g., in physical contact with) the seed layer 164c and over the dielectric layer 162c. As shown in FIG. 9, the seed layer 164c may be disposed between the dielectric layer 162c and the conductive layer 166c and between the conductive layers 166b and 166c. In some embodiments, the conductive layer 166c is overlapped with the seed layer 164c in the vertical projection on the dielectric layer 162a along the direction Z. That is to say, a sidewall of the seed layer 164c is substantially aligned with a sidewall of the conductive layer 166c. In the case, the conductive layer 166c and the seed layer 164c share the same geometrical shape on the top view, e.g., the X-Y plane. As shown in FIG. 9, the conductive layer 166c may include a plurality of conductive patterns/segments (not labeled, which are separated from one another) disposed on the seed layer 164c. In some embodiments, as shown in FIG. 9, the conductive layer 166c is physically connected to and electrically connected to the seed layer 164c respectively underlying thereto. In some embodiments, the conductive layer 166c and the seed layer 164c together are referred to as a metallization layer ML5 (or a redistribution layer/line) of the redistribution circuit structure 160. In some embodiments, the dielectric layer 162c and the metallization layer ML5 (including the seed layer 164c and the conductive layer 166c) are referred to as a third build-up layer of the redistribution circuit structure 160. For example, the conductive layer 166c is electrically coupled to the conductive layer 166b through the seed layer 164c.

Thereafter, the dielectric layer 168 is formed on the third build-up layer of the redistribution circuit structure 160, in some embodiment. For example, the dielectric layer 168 is disposed on (e.g., in physical contact with) the metallization layer ML5 and the dielectric layer 162c exposed by the metallization layer ML5. In some embodiments, the dielectric layer 168 has a plurality of openings O6 each exposing portions of the conductive layer 166c. As show in FIG. 9, through the openings O6, a surface TS166c of the conductive layer 166c is partially exposed for electrically connecting to later-formed connectors, for example. The dielectric layer 168 may be referred to as a capping layer of the redistribution circuit structure 160.

In some embodiments, the dielectric layers 162a, 162b, 162c and 168 are together referred to as a dielectric structure of the redistribution circuit structure 160, the metallization layers ML3, ML4, ML5 are together referred to as a routing structure of the redistribution circuit structure 160. If considering the dielectric layers 162a, 162b, 162c and 168 are made of the same material, there is no clear interface between any two adjacent layers of the dielectric layers 162a, 162b, 162c and 168. On the other hand, if considering any two adjacent layers of the dielectric layers 162a, 162b, 162c and 168 are made of different materials, there is a clear interface between the two adjacent layers of the dielectric layers 162a, 162b, 162c and 168.

Up to here, the redistribution circuit structure 160 is manufactured. In some embodiments, the first, second, and third build-up layers are electrically connected to one another. The redistribution circuit structure 160 may be disposed on and electrically connected to the conductive pillars 120 and the semiconductor die 140, as shown in FIG. 9. Although only one first build-up layer, one second build-up layer, and one third build-up layer are included in the redistribution circuit structure 160 as shown in FIG. 9 for illustrative purposes, the number of each of the first, second, and third build-up layers may not be limited to what is depicted in FIG. 9. For example, the number of each of the first, second, and third build-up layers may be one or more than one depending on the demand and design requirements; the disclosure is not limited thereto. As shown in FIG. 9, the redistribution circuit structure 160 may be referred to as a front-side redistribution circuit structure or layer of the semiconductor die 140, while the redistribution circuit structure 110 may be referred to as a back-side redistribution circuit structure or layer of the semiconductor die 140. In some embodiments, the redistribution circuit structure 110 is electrically coupled to the semiconductor die 140 through the conductive pillars 120 and the redistribution circuit structure 160.

The formations and materials of the dielectric layers 162a, 162b, 162c, and 168 may be the same or similar to the process and material of forming the dielectric layer 112a and/or 112b as described in FIG. 1 through FIG. 3, and thus are not repeated therein for brevity. In one embodiment, the materials of the dielectric layers 162a, 162b, 162c, and 168 are the same as the material of the dielectric layer 112a and/or 112b. In an alternative embodiment, the materials of the dielectric layers 162a, 162b, 162c, and 168 independently are different from the material of the dielectric layer 112a and/or 112b; the disclosure is not limited thereto. The formations and materials of the seed layers 164a, 164b and 164c may be the same or similar to the process and material of forming the seed layer 114a and/or 114b as described in FIG. 1 thorough FIG. 3, and thus are not repeated therein for brevity. In one embodiment, the materials of the seed layers 164a, 164b and 164c are the same as the material of the seed layer 114a and/or 114b. In an alternative embodiment, the materials of the seed layers 164a, 164b and 164c independently are different from the material of the seed layer 114a and/or 114b; the disclosure is not limited thereto. The formations and materials of the conductive layers 166a, 166b, and 166c may be the same or similar to the process and material of forming the conductive layer 116a and/or 166b as described in FIG. 1 through FIG. 3, and thus are not repeated therein for brevity. In one embodiment, the materials of the conductive layers 166a, 166b, and 166c are the same as the material of the conductive layer 116a and/or 116b. In an alternative embodiment, the materials of the conductive layers 166a, 166b, and 166c independently are different from the material of the conductive layer 116a and/or 116b; the disclosure is not limited thereto.

Figure 10:
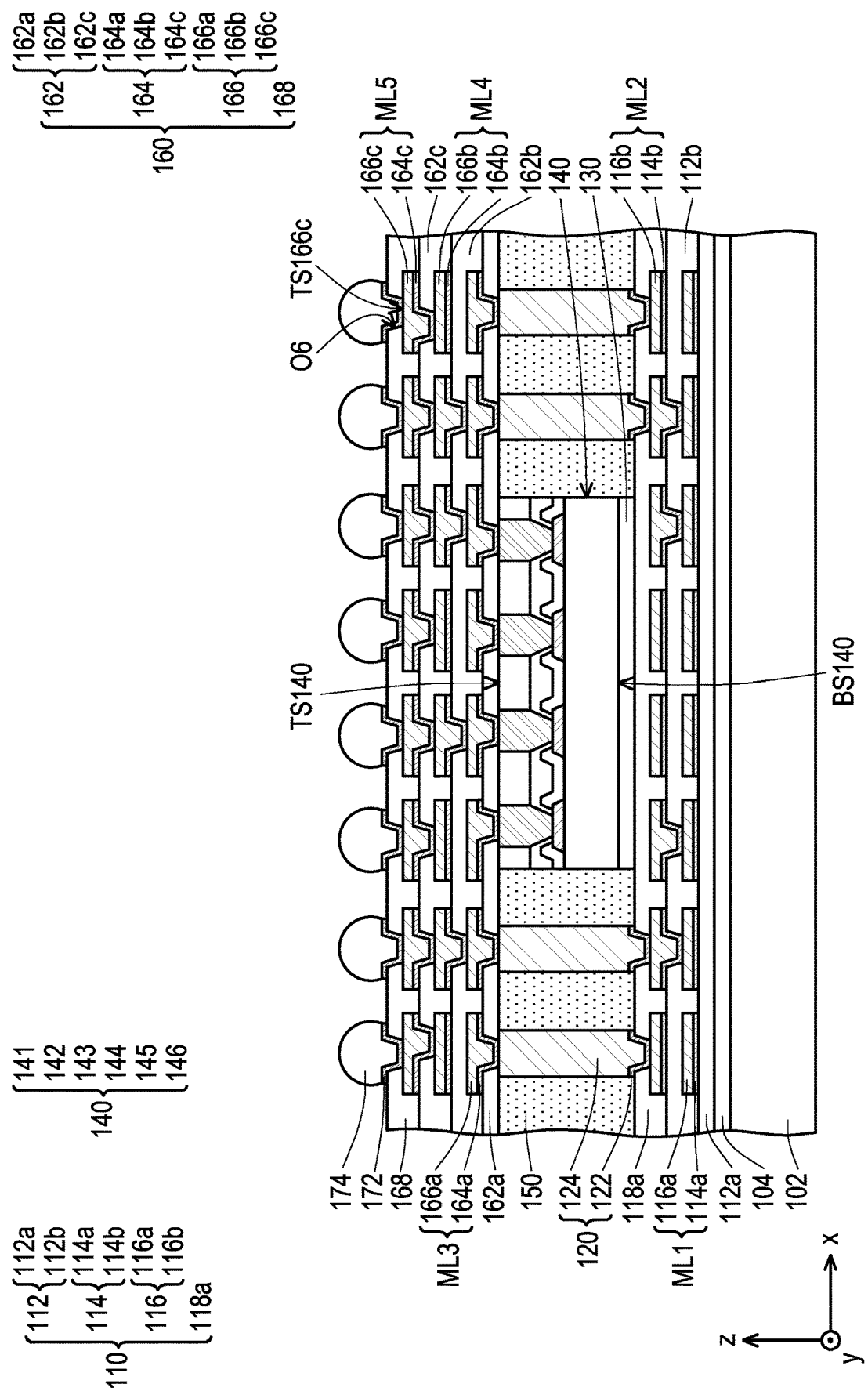

Referring to FIG. 10, in some embodiments, a plurality of under-ball metallurgy (UBM) patterns 172 and a plurality of conductive terminals 174 are sequentially formed over the redistribution circuit structure 160, in accordance with step S60 of FIG. 16. In some embodiments, the UBM patterns 172 each are located between a respective one of the conductive terminals 174 and the dielectric layer 168 of the redistribution circuit structure 160. Due to the UBM patterns 172, the adhesion strength between the conductive terminals 174 and the dielectric layer 168 of the redistribution circuit structure 160 is enhanced. In some embodiments, the conductive terminals 174 are electrically coupled to the redistribution circuit structure 160 through the UBM patterns 172. In some embodiments, some of the conductive terminals 174 are electrically coupled to the semiconductor die 140 through some of the UBM patterns 172 and the redistribution circuit structure 160. In some embodiments, some of the conductive terminals 174 are electrically coupled to the conductive pillars 120 through some of the UBM patterns 172 and the redistribution circuit structure 160. In some embodiments, some of the conductive terminals 174 are electrically coupled to the redistribution circuit structure 110 through some of the UBM patterns 172, the redistribution circuit structure 160, and the conductive pillars 120.

In some embodiments, the UBM patterns 172 are disposed on (e.g., in physical contact with) the conductive layer 166c exposed by the openings O6 formed in the dielectric layer 168. As shown in FIG. 10, in some embodiments, the UBM patterns 172 are physically connected to and electrically connected to the redistribution circuit structure 160. In some embodiments, the UBM patterns 172 are made of a metal layer including a single layer or a metallization layer including a composite layer with a plurality of sub-layers formed of different materials. In some embodiments, the UBM patterns 172 include copper, nickel, molybdenum, titanium, tungsten, titanium nitride, titanium tungsten, combinations thereof, or the like. The UBM patterns 172 may include a titanium layer and a copper layer over the titanium layer. The UBM patterns 172 may be formed using, for example, electroplating, sputtering, PVD, or the like. For example, the UBM patterns 172 are conformally formed on the dielectric layer 168 by sputtering to extend on an outermost surface of the dielectric layer 168 and further extend into the openings O6 formed in the dielectric layer 168, and thus are in physical contact with the surface TS166c of the conductive layer 166c exposed by the openings O6 formed in the dielectric layer 168. The UBM patterns 172 are electrically isolated from one another. The number of the UBM patterns 172 may not be limited in this disclosure, and may correspond to the number of the portions of the conductive layer 166c exposed by the openings O6 formed in the dielectric layer 168.

As shown in FIG. 10, in some embodiments, the conductive terminals 174 are physically connected to and electrically connected to the UBM patterns 172, and are electrically coupled to the redistribution circuit structure 160 through the UBM patterns 172. In some embodiments, the conductive terminals 174 are disposed on the UBM patterns 172 by ball placement process or reflow process. The conductive terminals 174 are, for example, solder balls or ball grid array (BGA) balls or bumps. Alternatively, the conductive terminals 174 may include micro-bumps, metal pillars, electroless nickel-electroless palladium-immersion gold (ENEPIG) formed bumps, controlled collapse chip connection (C4) bumps, or the like; and may be formed by plating. The conductive terminals 174 may be solder free. The number of the conductive terminals 174 may not be limited to the disclosure, and may be designated and selected based on the number of the UBM patterns 172.

However, the disclosure is not limited thereto. In some alternative embodiments, the UBM patterns 172 may be omitted. In such alternative embodiments, the conductive terminals 174 may be directly connected to (e.g., in physical contact with) the redistribution circuit structure 160 (e.g., the portions of the conductive layer 166c exposed by the openings O6). The conductive terminals 174 may be referred to as conductors or conductive connectors, in the disclosure.

Figure 11:
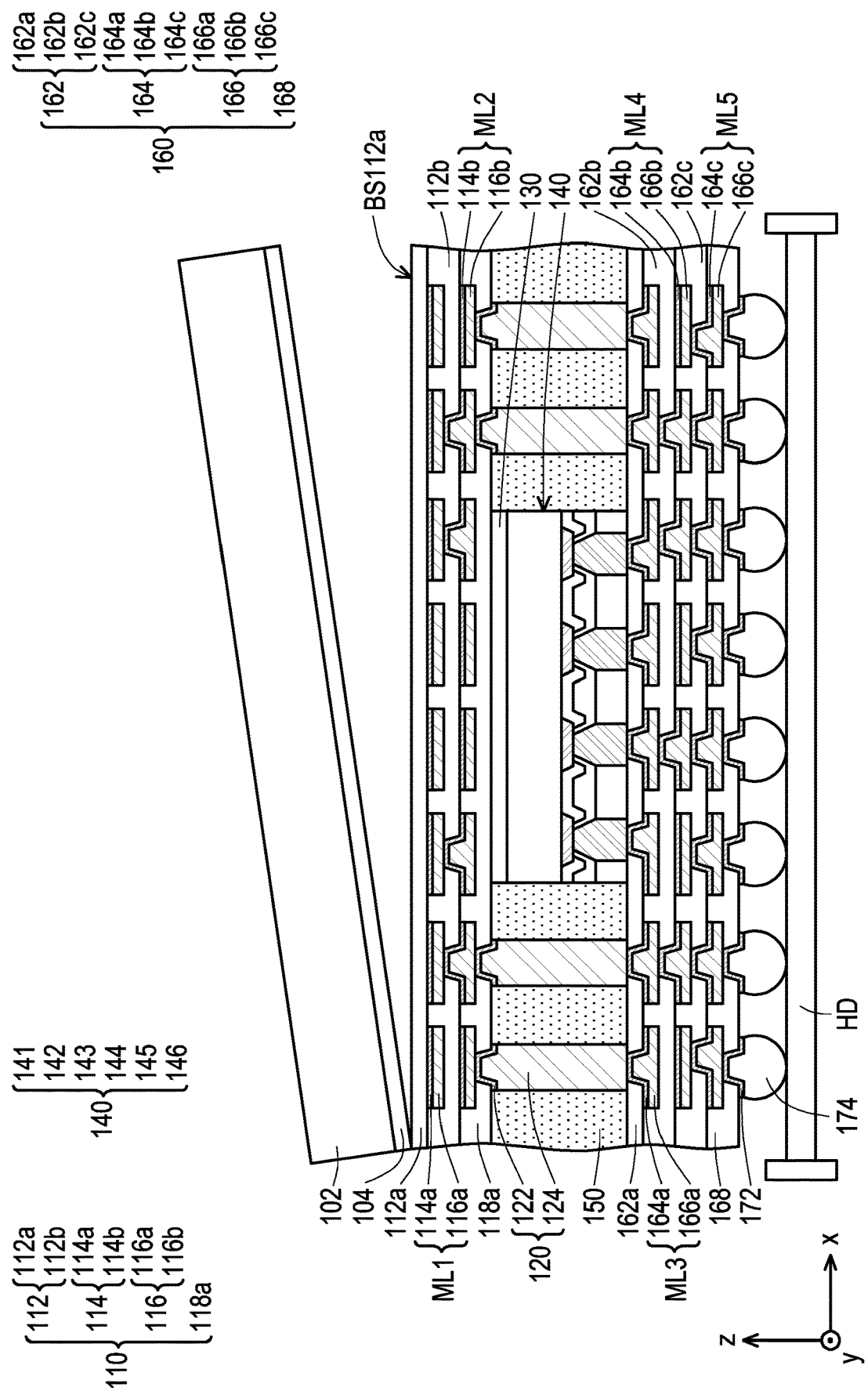

Referring to FIG. 11, in some embodiments, the whole structure depicted in FIG. 10 along with the carrier substrate 102 is flipped (turned upside down), where the conductive terminals 174 are placed to a holding device HD, and the carrier substrate 102 is then debonded from the dielectric layer 112a. In some embodiments, the holding device HD may be an adhesive tape, a carrier film or a suction pad being supported by a frame. The disclosure is not limited thereto. In some embodiments, the dielectric layer 112a is easily separated from the carrier substrate 102 due to the release layer 104. In some embodiments, the carrier substrate 102 is detached from the dielectric layer 112a through a debonding process, where the carrier substrate 102 and the release layer 104 are debonded and then removed. In some embodiments, after the deboning, a surface BS112a of the dielectric layer 112a is exposed, as show in FIG. 11. In one embodiment, the debonding process is a laser debonding process. During the debonding step, the holding device HD is used to secure the structure depicted in FIG. 10 before debonding the carrier substrate 102 and the release layer 104.

Figure 12:
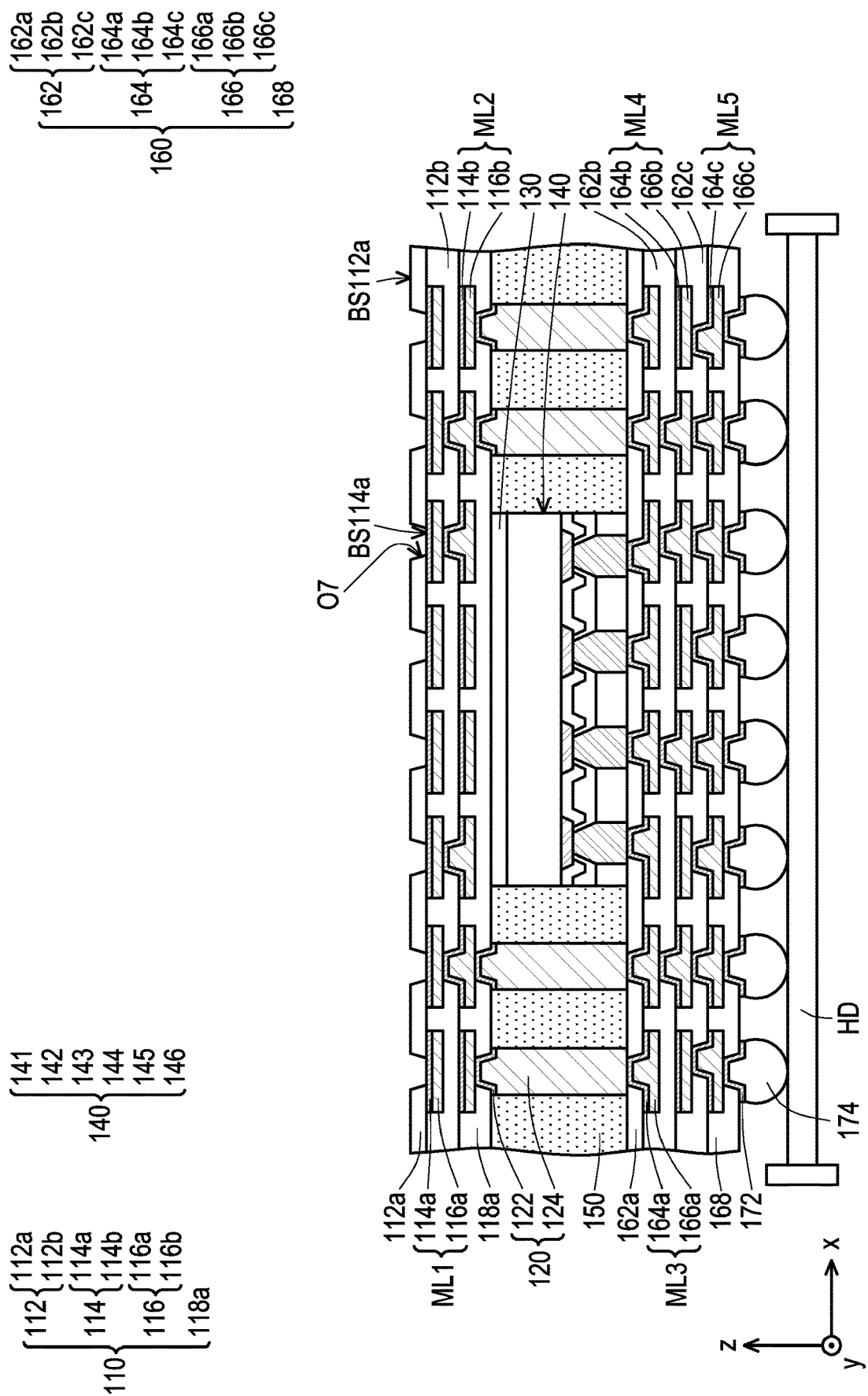

Referring to FIG. 12, in some embodiments, the dielectric layer 112a is patterned to include a plurality of openings O7 formed therethrough and each exposing a portion of the seed layer 114a. As show in FIG. 12, through the openings O7, a surface BS114a of the seed layer 114a is partially exposed for electrically connecting to later-formed connectors, for example. In other words, portions of the seed layer 114a exposed by the openings O7 may be referred to as conductive terminals, conductors, or conductive connectors, in the disclosure. In some embodiments, the patterning includes a laser drilling process, a mechanical drilling process, or other suitable processes. In alternative embodiments, the patterning includes an etching process such as a dry etching, a wet etching, or a combination thereof. The disclosure is not limited thereto.

Figure 13:
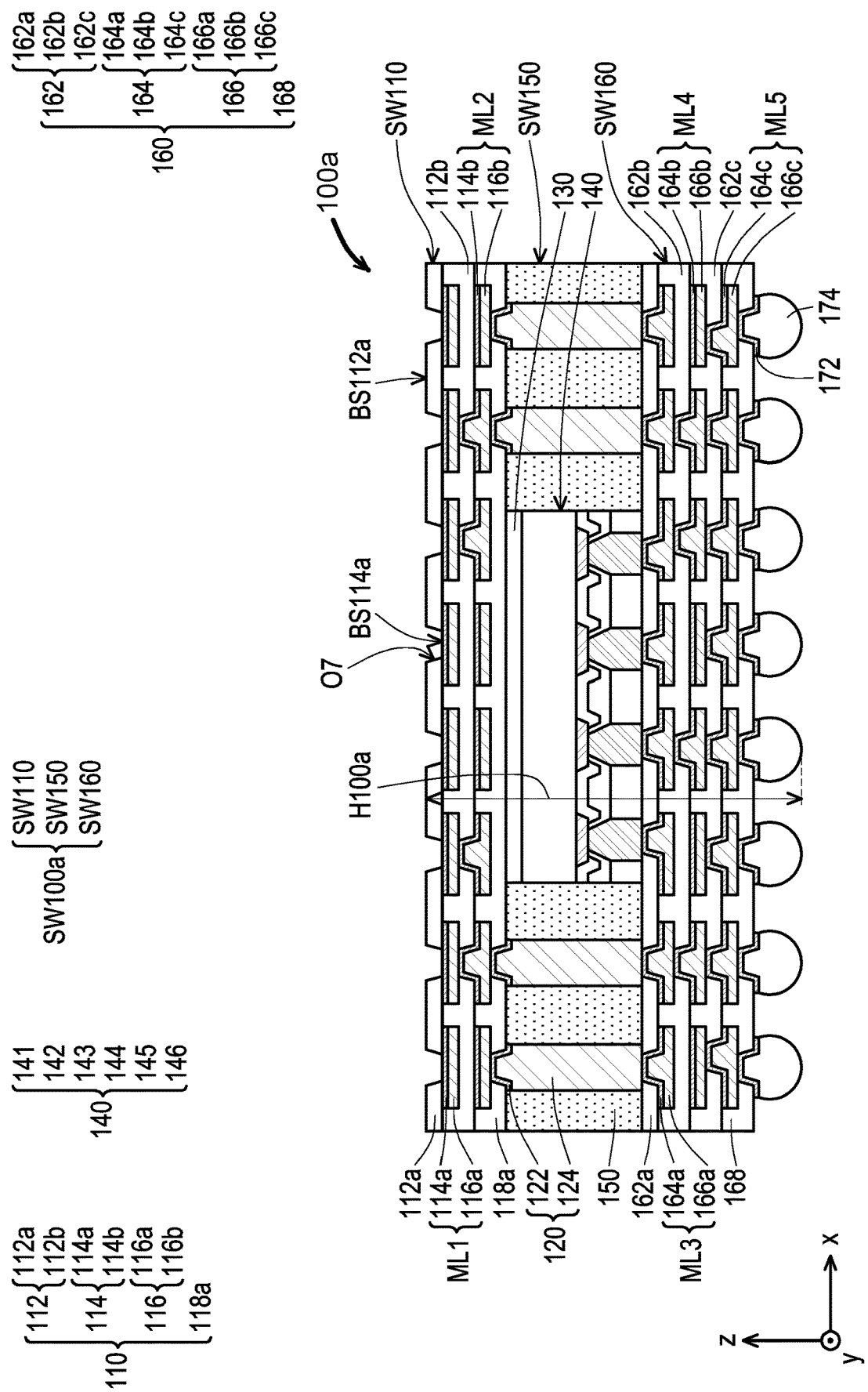

Referring to FIG. 13, in some embodiments, a dicing (or singulation) process is sequentially performed to cut through the whole structure depicted in FIG. 12 (e.g., including a plurality of the package structure 100a interconnected therebetween) to form a plurality of individual and separated package structures 100a. For simplicity, only one package structure 100a is illustrated in FIG. 13 for illustrative purposes. In one embodiment, the dicing process is a wafer dicing process including mechanical blade sawing, or laser cutting; the disclosure is not limited thereto. Up to this, the package structure 100a is manufactured. The package structure 100a is referred to as an integrated fan-out (InFO) package, which has dual-side terminals (e.g., 114a and 174).

In some embodiments, after dicing, a sidewall SW110 of the redistribution circuit structure 110, a sidewall SW150 of the insulating encapsulation 150, and a sidewall SW160 of the redistribution circuit structure 160 are substantially aligned to each other, in the package structure 100a depicted in FIG. 13. That is, the sidewall SW110 of the redistribution circuit structure 110, the sidewall SW150 of the insulating encapsulation 150, and the sidewall SW160 of the redistribution circuit structure 160 together constitute a sidewall SW100a of the package structure 100a.

In one scenario of the disclosure, due to the dielectric layer 118a is thinned, an overall thickness H100a of the package structure 100a is reduced. In another scenario of the disclosure, due to the dielectric layer 118a is thinned, a thickness H141 (denoted in FIG. 8) of the semiconductor substrate 141 of the semiconductor die 140 is increased to facilitate the heat dissipation of the package structure 100a, where the overall thickness H100a of the package structure 100a is maintained the same. In another scenario of the disclosure, due to the dielectric layer 118a is thinned, the thickness H130 of the connecting film 130 (as being the thermally conductive die attach film) is increased to facilitate the heat dissipation of the package structure 100a, where the overall thickness H100a of the package structure 100a is maintained the same.

In one scenario of the disclosure, due to the dielectric layer 118a and the connecting film 130 (as being the non-thermally conductive die attach film) are thinned, an overall thickness H100a of the package structure 100a is reduced. In another scenario of the disclosure, due to the dielectric layer 118a and the connecting film 130 (as being the non-thermally conductive die attach film) are thinned, the thickness H141 (denoted in FIG. 8) of the semiconductor substrate 141 of the semiconductor die 140 is increased to facilitate the heat dissipation of the package structure 100a, where the overall thickness H100a of the package structure 100a is maintained the same.

In addition, additional conductive terminals may be mounted to the package structure 100a, so to obtain another structure of InFO package of dual-side terminals. FIG. 14 is a schematic cross-sectional view of a package structure 100b in accordance with some embodiments of the disclosure. The elements similar to or substantially the same as the elements described previously will use the same reference numbers, and certain details or descriptions (e.g., the materials, formation processes, positioning configurations, electrical connection, etc.) of the same elements would not be repeated herein. The package structure 100b may be referred to as an InFO package, which has dual-side terminals.

Referring to FIG. 14, in some embodiments, a plurality of under-ball metallurgy (UBM) patterns 182 and a plurality of conductive terminals 184 are sequentially formed on the dielectric layer 112a of the redistribution circuit structure 110, in accordance with step S70 of FIG. 16. In some embodiments, the UBM patterns 182 each are located between a respective one of the conductive terminals 184 and the dielectric layer 112a. Due to the UBM patterns 182, the adhesion strength between the conductive terminals 184 and the dielectric layer 112a is enhanced. The formations and materials of the UBM patterns 182 and the conductive terminals 184 are similar to or substantially identical to the formations and materials of the UBM patterns 172 and the conductive terminals 174 as described in FIG. 10, respectively; thus, are not repeated herein for brevity. In some embodiments, the UBM patterns 182 are disposed on (e.g., in physical contact with) the seed layer 114a exposed by the openings O7 formed in the dielectric layer 112a. As shown in FIG. 14, for example, the UBM patterns 182 are physically connected to and electrically connected to the seed layer 114a of the redistribution circuit structure 110.

In some embodiments, the conductive terminals 184 are electrically coupled to the redistribution circuit structure 110 through the UBM patterns 182. In some embodiments, some of the conductive terminals 184 are electrically coupled to the conductive pillars 120 through some of the UBM patterns 182 and the redistribution circuit structure 110. In some embodiments, some of the conductive terminals 184 are electrically coupled to the redistribution circuit structure 160 through some of the UBM patterns 182, the redistribution circuit structure 110, and the conductive pillars 120. In some embodiments, some of the conductive terminals 184 are electrically coupled to the semiconductor die 140 through some of the UBM patterns 182, the redistribution circuit structure 110, the conductive pillars 120, and the redistribution circuit structure 160. In some embodiments, some of the conductive terminals 184 are electrically coupled to the conductive terminals 174 through some of the UBM patterns 182, the redistribution circuit structure 110, the conductive pillars 120, the redistribution circuit structure 160, and some of the UBM patterns 172.

However, the disclosure is not limited thereto. In alternative embodiments, the UBM patterns 182 are be omitted, where the conductive terminals 184 are directly connected to (e.g., in physical contact with) the redistribution circuit structure 110 (e.g., the portions of the seed layer 114a exposed by the openings O7). In such alternative embodiments, the conductive terminals 184 may be referred to as conductors or conductive connectors. In further alternative embodiments, the conductive terminals 184 are omitted, where the UBM patterns 182 are referred to as conductive terminals, conductors, or conductive connectors.

Up to here, the package structure 100b is manufactured. The formation of the package structure 100b may include, but not limited to, forming the UBM patterns 182 and the conductive terminals 184 on the redistribution circuit structure 110 prior to the dicing process as described in FIG. 13.

In addition, one or more than one package (such as a memory package or the like) may be mounted to the package structure 100a or 100b having a structure of InFO package to form a semiconductor package having a package-on-package (PoP) structure. FIG. 15 is a schematic cross-sectional view of a package structure 1000 in accordance with some embodiments of the disclosure. The elements similar to or substantially the same as the elements described previously will use the same reference numbers, and certain details or descriptions (e.g., the materials, formation processes, positioning configurations, etc.) of the same elements would not be repeated herein. The package structure 1000 may be referred to as an InFO-PoP package.

Referring to FIG. 15, in some embodiments, a package 800 is provided and bonded to the package structure 100b depicted in FIG. 14 to form the package structure 1000 having the PoP structure, in accordance with step S80 of FIG. 16. The details of the package structure 100b have been previously described in FIG. 14 in conjunction with FIG. 1 through FIG. 13, and thus are not repeated herein for brevity. In some embodiments, the package 800 includes a substrate 810, semiconductor dies 820a and 820b, bonding wires 830a and 830b, conductive pads 840 and 850, an insulating encapsulation 860. Alternatively, the package 800 may further include the joining solder balls or pre-solders (not shown).

As shown in FIG. 15, for example, the semiconductor die 820a with a connecting film DA1 disposed thereon and the semiconductor die 820b with a connecting film DA2 disposed thereon are provided and are disposed on the substrate 810. In some embodiments, the connecting film DA1 is located between the semiconductor die 820a and the substrate 810, and the connecting film DA2 is located between the semiconductor die 820a and the semiconductor die 820b. In some embodiments, due to the connecting films DA1 and DA2 respectively provided between the semiconductor die 820a and the substrate 810 and between the semiconductor dies 820a and 820b, the semiconductor dies 820a, 820b are stably adhered to the substrate 810. In some embodiments, the connecting films DA1, DA2 may be, for example, a die attach film, a layer made of adhesives or epoxy resin, or the like.

For example, the semiconductor dies 820a and 820b are mounted on one surface (e.g., a surface S1) of the substrate 810. The semiconductor dies 820a and 820b independently may be a logic chip (e.g., CPU, GPU, NPU, DPU, TPU, SoC, AP, a microcontroller, etc.), a memory chip (e.g., a DRAM chip, a RRAM chip, a MRAM chip, a SRAM chip, a NAND flash memory, WIO, a HBM module, a HMC module, etc.), a power management chip (e.g., a PMIC chip), a RF chip, a BB chip, a sensor chip, a MEMS chip, a signal processing chip (e.g., a DSP chip), a front-end chip (e.g., AFE chips), the like, or a combination thereof. In one embodiment, the semiconductor dies 820a and 820b may be the same. For example, as shown in FIG. 16, the semiconductor dies 820a and 820b are DRAM chips, where the package 800 is referred to as a memory package. However, the disclosure is not limited thereto; alternatively, the semiconductor dies 820a and 820b may be different from each other.

In some embodiments, the bonding wires 830a and 830b are respectively used to provide electrical connections between the semiconductor dies 820a, 820b and some of the conductive pads 840 (such as bonding pads) located on the surface S1 of the substrate 810. Owing to the bonding wires 830a and 830b, the semiconductor dies 820a and 820b are electrically connected to the substrate 810.

In some embodiments, the insulating encapsulation 860 is formed on the surface S1 of the substrate 810 to encapsulate the semiconductor dies 820a, 820b, the bonding wires 830a, 830b and the conductive pads 840 to protect these components. A formation and material of the insulating encapsulation 860 is similar to or substantially identical to the process and material of forming the encapsulation material 150m as described in FIG. 7 and/or the insulating encapsulation 150 as described in FIG. 8, and thus are not repeated herein for brevity. In one embodiment, the insulating encapsulation 860 is the same as the insulating encapsulation 150. In an alternative embodiment, the insulating encapsulation 860 is different from the insulating encapsulation 150, the disclosure is not limited thereto.

In some embodiments, interconnects (not shown) and/or through-insulator-vias (not shown) embedded in the substrate 810 may be used to provide electrical connection between the conductive pads 840 and the conductive pads 850 (such as bonding pads) that are located on another surface (e.g., a surface S2 opposite to the surface S1 in the direction Z) of the substrate 810. In some embodiments, some of the conductive pads 850 are electrically coupled to the semiconductor dies 820a and 820b through these through-insulator-vias and/or interconnects in addition to some of the conductive pads 840 and the bonding wires 830a, 830b. Furthermore, some of the conductive pads 840 may be electrically coupled to each other through the interconnects, and some of the conductive pads 850 may be electrically coupled to each other through the interconnects.

In some embodiments, the conductive pads 850 of the package 800 are connected to and electrically coupled to the conductive terminals 184 of the package structure 100b, and thus the package 800 is electrically coupled to the package structure 100b. In some embodiments, the redistribution circuit structure 110 is electrically coupled to the substrate 810 of the package 800 through the conductive terminals 184 and the conductive pads 850. In some embodiments, the semiconductor dies 820a, 820b are electrically communicated to the semiconductor die 140.

In addition, as shown in FIG. 15, an insulating material 190 is optionally disposed in a gap between the package structure 100b and the package 800 and wraps around the conductive terminals 184 of the package structure 100b, for example. Owing to the insulating material 190, the bonding strength between the package structure 100b and the package 800 is enhanced, thereby improving the reliability of the package structure 1000. The insulating material 190 may be an underfill made of any acceptable material, such as polymer, epoxy, molding underfill, or the like. The insulating material 190 may be formed by underfill dispensing or any other suitable method. Alternatively, the insulating material 190 may be omitted.

The formation of the package structure 1000 may include, but not limited to, bonding the package 800 to the package structure 100b after forming the conductive terminals 184 as described in FIG. 14 and prior to the dicing process as described in FIG. 13; applying the insulating material 190 in the gap between the package structure 100b and the package 800; and performing the dicing process as described in FIG. 13 to cut through a plurality of the packages 800 interconnected therebetween, a plurality of the package structures 100b interconnected therebetween, and the insulating material 190 interposed therebetween into a plurality of individual and separated package structures 1000. For simplicity, only one package structure 1000 is illustrated in FIG. 15 for illustrative purposes. In some embodiments, after dicing, a sidewall SW800 of the package 800, a sidewall SW190 of the insulating material 190, and the sidewall SW100b of the package structure 100b are substantially aligned to each other, in the package structure 1000 depicted in FIG. 15. That is, the sidewall SW800 of the package 800, the sidewall SW190 of the insulating material 190, and the sidewall SW100b of the package structure 100b together constitute a sidewall of the package structure 1000. In the case, for the package structure 1000 of FIG. 15, a lateral size W800 of the package 800 is substantially equal to a lateral size W100b of the package structure 100b.

However, the disclosure is not limited thereto; alternatively, the formation of the package structure 1000 may include bonding the package 800 to the package structure 100b after forming the conductive terminals 184 as described in FIG. 14 and prior to the dicing process as described in FIG. 13; applying the insulating material 190 in the gap between the package structure 100b and the package 800; and performing the dicing process as described in FIG. 13 to cut through only the insulating material 190 and a plurality of the package structures 100b interconnected therebetween into individual and separated package structures 1000. In the case, the lateral size of the package 800 is less than the lateral size of the package structure 100b, where the sidewall of the package 800 is not aligned with the sidewall of the insulating material 190 and the sidewall of the package structure 100b. The sidewall of the package 800 may be free of the insulating material 190. The sidewall of the package 800 may be at least partially covered by the insulating material 190.

Or alternatively, the formation of the package structure 1000 may include bonding the package 800 to the package structure 100b after the dicing process as described in FIG. 13; and then applying the insulating material 190 in the gap between the package structure 100b and the package 800 to form the package structure 1000. In the case, the lateral size of the package 800 is may be less than, greater than, or substantially equal to the lateral size of the package structure 100b, where the sidewall of the package 800 is not aligned with the sidewall of the insulating material 190 and the sidewall of the package structure 100b. The sidewall of the package 800 may be free of the insulating material 190. The sidewall of the package 800 may be at least partially covered by the insulating material 190.

Figure 18:
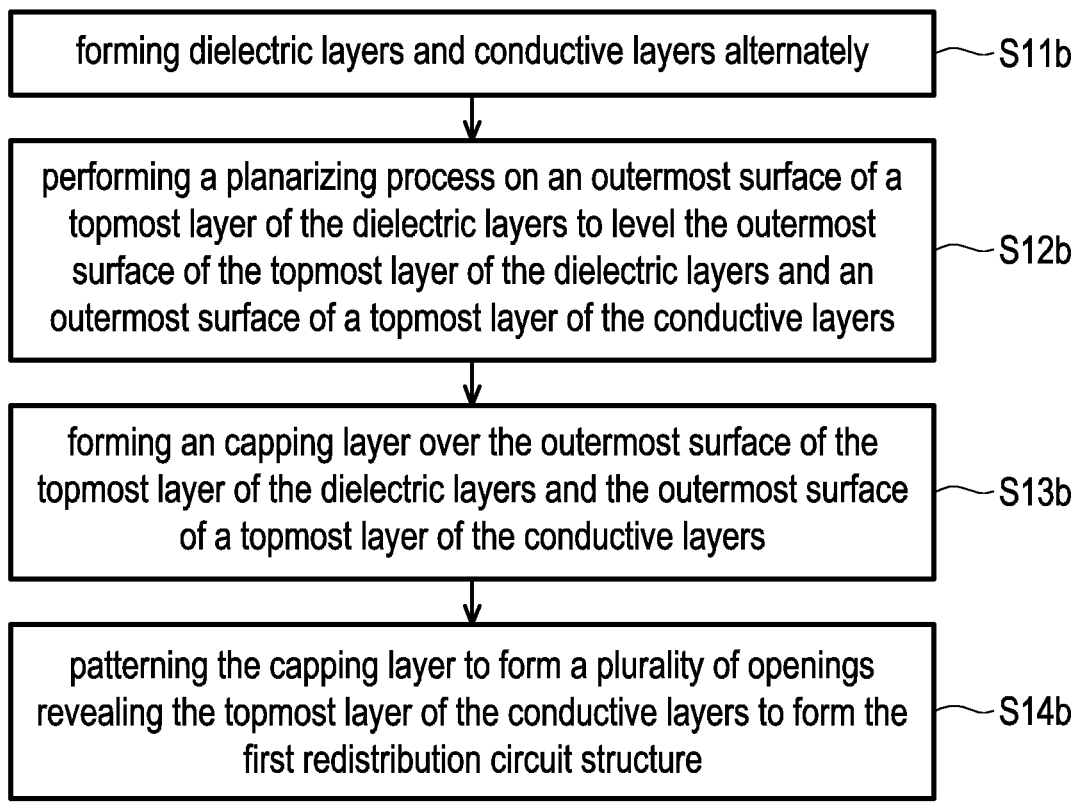
FIG. 18 is a flow chart illustrating a method of manufacturing a redistribution circuit structure in accordance with some alternative embodiments of the disclosure.

In the disclosure, alternatively, the redistribution circuit structure 110 may be substituted by a redistribution circuit structure 110A. In some embodiments, the redistribution circuit structure 110A includes at least one dielectric layer 112 (e.g., 112a and 112b), at least one seed layer 114 (e.g., 114a and 114b), at least one conductive layer 116 (e.g., 116a and 116b), a dielectric layer 118b, and a dielectric 50. However, the numbers of layers of the dielectric layer 112, the seed layer 114, and the conductive layer 116 are not limited to what is depicted in the disclosure, where the numbers of the layers of the dielectric layer 112, the seed layer 114, and the conductive layer 116 may be one or more than one depending upon the demand and design requirements. In some embodiments, one conductive layer 116 includes a line portion extending along a horizontal direction (e.g., a direction X or Y), a via portion extending along a vertical direction (e.g., a direction Z) connecting to the line portion, or a combination thereof. The directions X, Y and Z may be different from each other. For example, the directions X, Y and Z are perpendicular to each other. FIG. 18 is a flow chart illustrating a method of manufacturing the redistribution circuit structure 110A in accordance with some embodiments of the disclosure. FIG. 19 through FIG. 22 are schematic cross-sectional views of various stages in a manufacturing method of a package structure 200a in accordance with some embodiments of the disclosure. The elements similar to or substantially the same as the elements described previously will use the same reference numbers, and certain details or descriptions (e.g., the materials, formation processes, positioning configurations, etc.) of the same elements would not be repeated herein.

Figure 19:
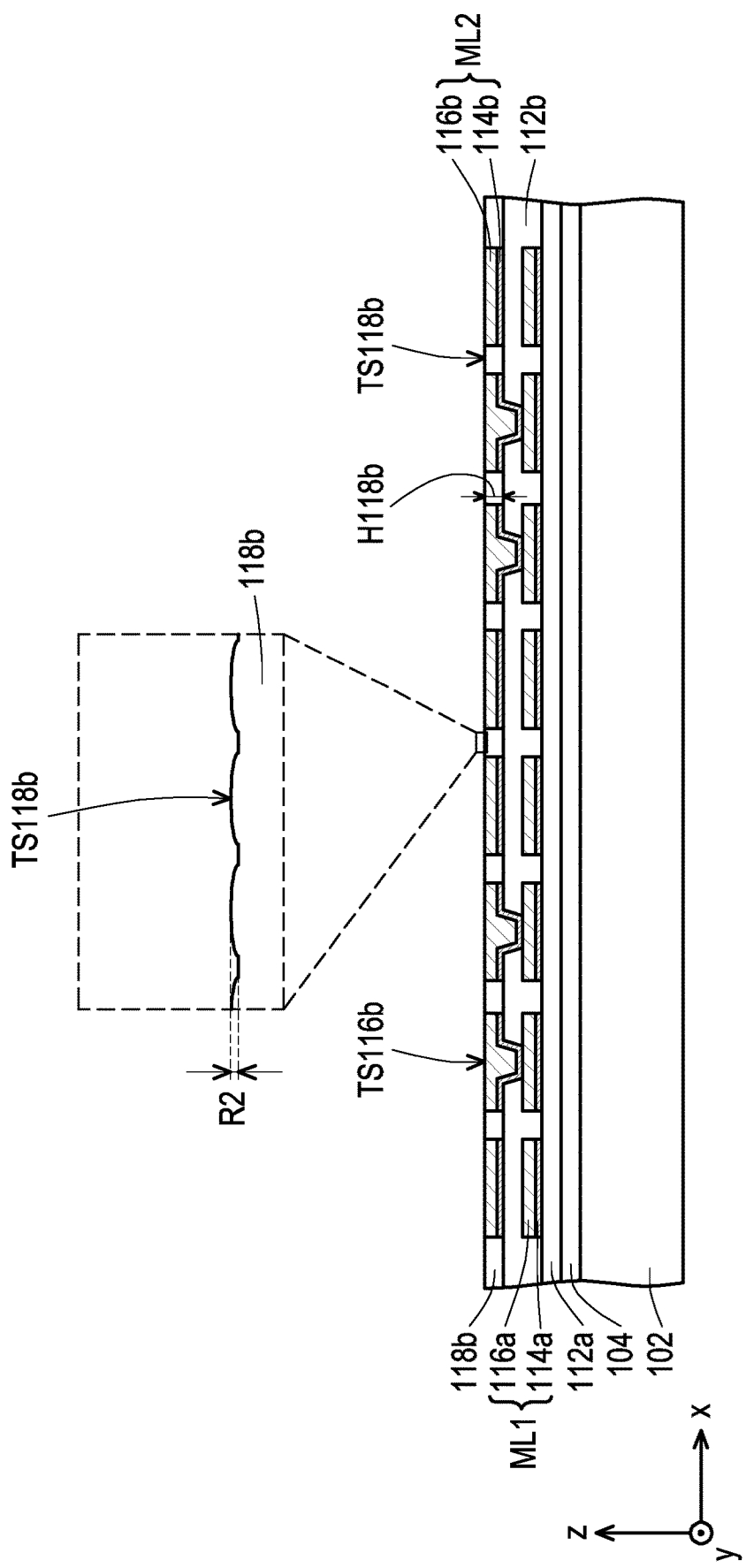
FIG. 19 through FIG. 22 are schematic cross-sectional views of various stages in a manufacturing method of a package structure in accordance with some alternative embodiments of the disclosure.

Referring to FIG. 19, in some embodiments, a planarizing process is performed on the dielectric layer 118m to form a dielectric layer 118b exposing the conductive layer 116b, following the process as described in FIG. 3; in accordance with step S12b of FIG. 18. It is appreciated that the processes as described in FIG. 1 through FIG. 3 are also in accordance with step S11b of FIG. 18. In some embodiments, during the planarizing process, the dielectric layer 118m is thinned until the surface TS116b of the conductive layer 116b is accessibly revealed. For example, the dielectric layer 118b is disposed on (e.g., in physical contact with) the dielectric layer 112b exposed by the conductive layer 116b and the seed layer 114b and laterally covers (e.g., in physical contact with) the conductive layer 116b and the seed layer 114b. In some embodiments, a surface TS118b of the dielectric layer 118b is considered as a substantially planar surface, which has a surface roughness R2 (e.g., a difference between a surface peak to a surface valley along the direction Z) being less than or substantially equal to 2 μm. In one embodiment, the surface roughness R2 is ranging about 0.5 µm to about 2 µm. In an alternative embodiment, the surface roughness R2 is ranging about 1 µm to about 2 µm. In the disclosure, the surface roughness R2 is in an acceptable tolerance, for example, less than or substantially equal to 2 µm. As the surface roughness R2 falls within the acceptable tolerance, the surface TS118b of the dielectric layer 118b is substantially flat and planar. As shown in FIG. 19, the surface TS118b of the dielectric layer 118b, for example, provides a high degree of coplanarity and flatness. Due to the high degree of coplanarity and flatness in the surface TS118b of the dielectric layer 118b, the formation of the later-formed layer(s) and/or element(s) is beneficial, such as a process window of a pick-and-place process for a semiconductor die is enlarged.

In some embodiments, the dielectric material layer 118m is planarized by a mechanical grinding process, a CMP process, an etching process, or combinations thereof. The etching process may include a dry etching, a wet etching, or a combination thereof. After the planarizing process, a cleaning process may be optionally performed, for example to clean and remove the residue generated from the planarizing process. However, the disclosure is not limited thereto, and the planarizing process may be performed through any other suitable method. In some embodiments, during the planarizing process of the dielectric material layer 118m, portions of the conductive layer 116b are slightly planarized as well. As shown in FIG. 19, the surface TS118b of the dielectric layer 118b is substantially leveled with the surface TS116b of the conductive layer 116b, for example. For example, the surface TS118b of the dielectric layer 118b and the surface TS116b of the conductive layer 116b are substantially coplanar to each other. As shown in FIG. 19, for example, the dielectric layer 118b has a thickness H118b ranging from about 2 µm to about 30 µm.

Figure 20:
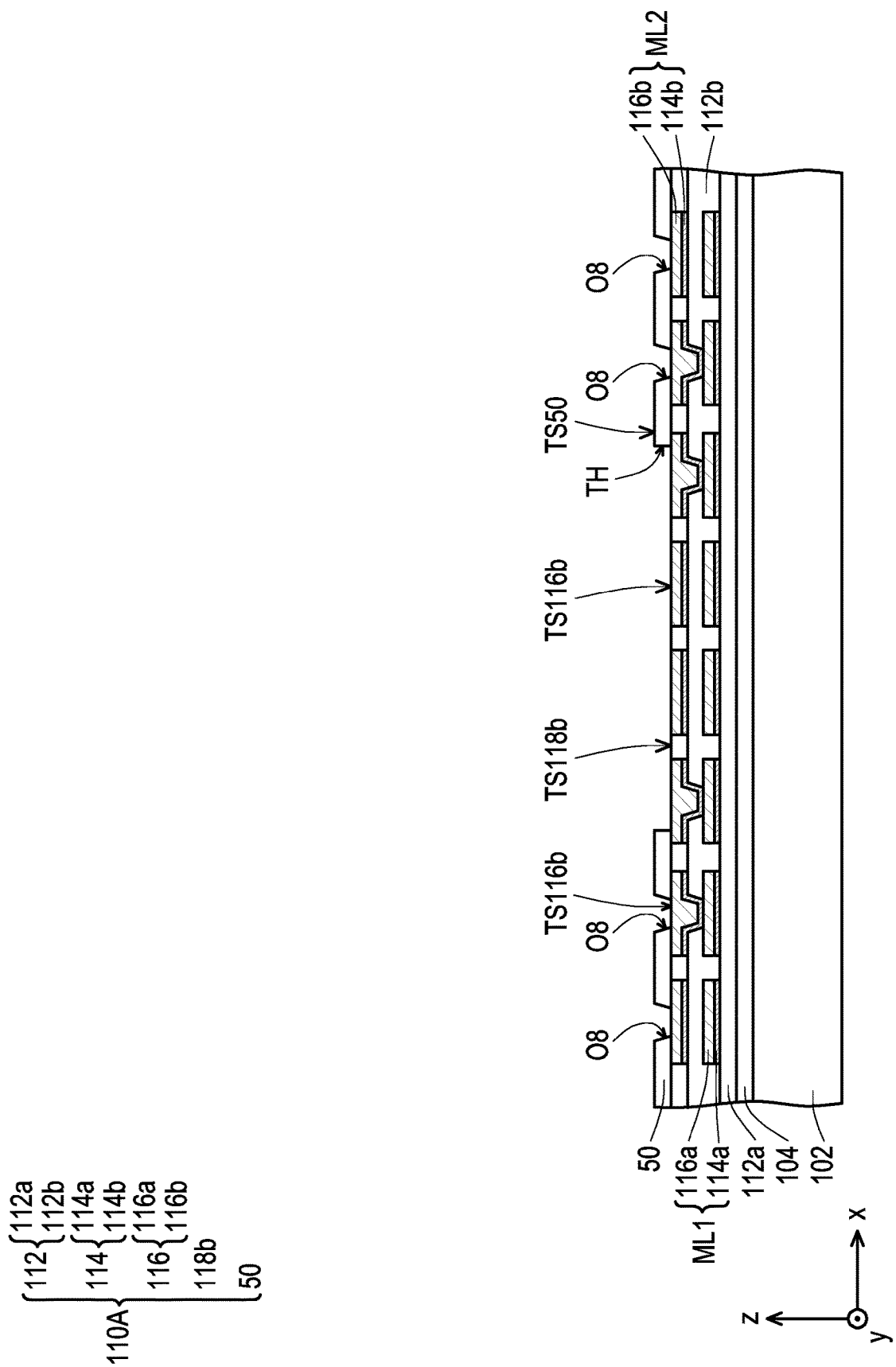

Referring to FIG. 20, in some embodiments, a dielectric layer 50 is formed on the structure depicted on FIG. 19. For example, the dielectric layer 50 is disposed on (e.g., in physical contact with) the metallization layer ML2 and the dielectric layer 118b laterally covering the metallization layer ML2. In some embodiments, the dielectric layer 50 has a plurality of openings O8 each exposing a portion of the conductive layer 116b and at least one trench (referred to as hole, opening, recess) TH exposing a portion of the conductive layer 116b and a portion of the dielectric layer 118b. As show in FIG. 20, through the openings O7, the surface TS116b of the conductive layer 116b is partially exposed for electrically connecting to later-formed connectors, for example. On the other hand, the trenches TH is corresponding to a positioning location of a semiconductor die later-disposed thereon. In some embodiments, the dielectric layer 50 is formed by, but not limited to, forming a blanket layer of dielectric material over the surface TS116b of the conductive layer 116b and the surface TS118b of the dielectric layer 118b (in accordance with step S13b of FIG. 18), and patterning the dielectric material blanket layer to form the dielectric layer 50 with the openings O8 exposing portions of the conductive layer 116b underneath thereto and the trench TH exposing portions of the conductive layer 116b and the dielectric layer 118b underneath thereto (in accordance with step S14b of FIG. 18). The patterning may include a dry etching, a wet etching, or a combination thereof. The formation and material of the dielectric layer 50 may be the same or similar to the process and material of forming the dielectric layer 112a, 112b, and/or 118b as described in FIG. 1 through FIG. 3, and thus are not repeated therein for brevity. In one embodiment, the material of the dielectric layer 50 is the same as the material of the dielectric layer 112a, 112b, and/or 118b. For example, the dielectric material layers 118b and 50 are made of PI, while at least one of the dielectric layers 112a and 112b is also made of PI. In an alternative embodiment, the material of the dielectric layer 50 is different from the material of the dielectric layer 112a, 112b, and/or 118b; the disclosure is not limited thereto. The dielectric layer 118b and dielectric layer 50 may be together referred to as a capping layer of the redistribution circuit structure 110A.

In some embodiments, the dielectric layers 112a, 112b, 118b, and 50 are together referred to as a dielectric structure of the redistribution circuit structure 110A, a metallization layer ML1 (including 114a and 116a; referred to as a redistribution layer/line) and a metallization layer ML2 (including 114b and 116b; referred to as a redistribution layer/line) are together referred to as a routing structure of the redistribution circuit structure 110A. If considering the dielectric layers 112a, 112b, 118b, and 50 are made of the same material, there is no clear interface between any two adjacent layers of the dielectric layers 112a, 112b, 118b, and 50. On the other hand, if considering any two adjacent layers of the dielectric layers 112a, 112b, 118b, and 50 are made of different materials, there is a clear interface between the two adjacent layers of the dielectric layers 112a, 112b, 118b, and 50.

Up to here, the redistribution circuit structure 110A is manufactured. For example, in the redistribution circuit structure 110A, a first build-up layer including the metallization layer ML1 and the dielectric layer 112a is electrically connected to a second build-up layer including the metallization layer ML2 and the dielectric layer 112b. Although only one first build-up layer and one second build-up layer are included in the redistribution circuit structure 110A as shown in FIG. 20 for illustrative purposes, the number of each of the first and second build-up layers may not be limited to what is depicted in FIG. 20. For example, the number of each of the first and second build-up layers may be one or more than one. The disclosure is not limited thereto.

Figure 21:
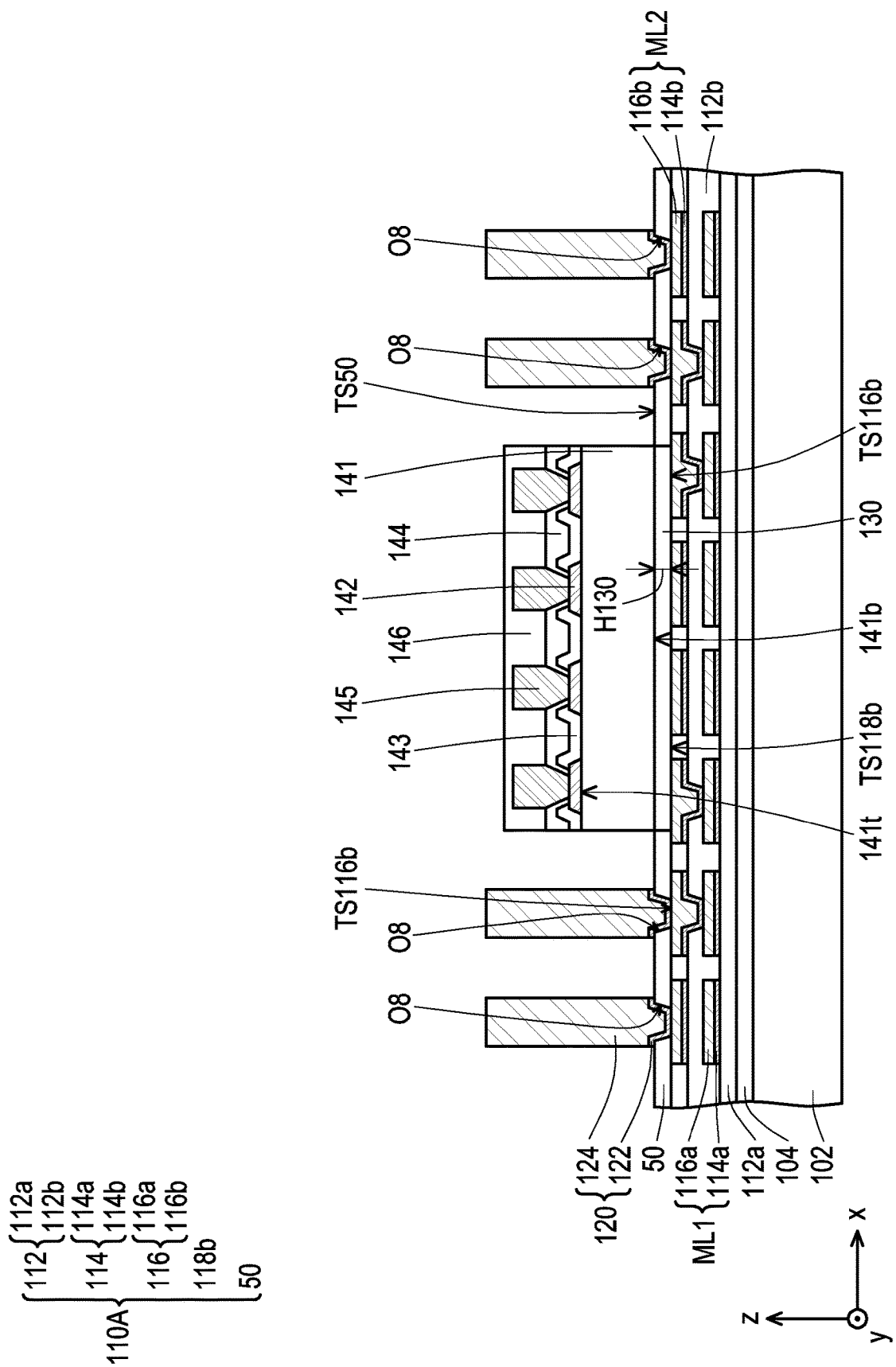

Referring to FIG. 21, in some embodiments, at least one conductive pillar 120 and at least one semiconductor die 140 are formed on the redistribution circuit structure 110A and over the carrier substrate 102. For illustrative purposes, the at least one conductive pillar 120 includes a plurality of conductive pillars 120 (e.g., four conductive pillars 120), and at least one semiconductor die 140 includes one semiconductor die 140, as presented in FIG. 21. However, the number of the conductive pillars 120 and the number of the semiconductor die 140 are not limited to what is depicted in the disclosure, and may be selected and designated based on the demand and design requirements. The number of the conductive pillars 120 may be more than or less than four, and the number of the semiconductor die 140 may be more than one. For example, the number of the conductive pillars 120 can be adjusted by changing the number of the openings O8 formed in the dielectric layer 50, and the number of the semiconductor die 140 can be adjusted by changing the number of the trench TH formed in the dielectric layer 50. In some embodiments, the conductive pillars 120 and the semiconductor die 140 are arranged side-by-side on a side of the redistribution circuit structure 110A.

In some embodiments, the conductive pillars 120 are disposed on the redistribution circuit structure 110A and extend into the openings O8 to physically connect to and electrically connect to the metallization layer ML2 of the redistribution circuit structure 110A. As shown in FIG. 21, the conductive pillars 120 are in physical contact with the conductive layer 116b through the openings O8 formed in the dielectric layer 50, for example. In some embodiments, the conductive pillars 120 each include a seed pattern 122 and a conductive via 124 standing thereon. As shown in FIG. 21, the seed patterns 122 may be disposed on the surface TS50 of the dielectric layer 50 and further extended into the openings O8, and the conductive vias 124 may be respectively disposed on (e.g., in physical contact with) the seed patterns 122. In the case, the seed patterns 122 penetrate through the dielectric layer 50, and sidewalls of the openings O8 are completely covered by (e.g., lined with) the seed patterns 122. In other words, the conductive pillars 120 penetrate through the dielectric layer 50 and stand on the surface TS118b of the dielectric layer 118b and the surface TS116b of the conductive layer 116b, where the conductive vias 124 are electrically coupled to the conductive layer 116b through the seed patterns 122. In some embodiments, in the vertical projection on the dielectric layer 112a along the direction Z, the conductive vias 124 are completely overlapped with the seed patterns 122. That is to say, a sidewall of one conductive via 124 may be substantially aligned with a sidewall of a respective one seed pattern 122. For example, one conductive via 124 and the respective one seed pattern 122 share the same geometrical shape on the top view, e.g., the X-Y plane. The details of the conductive pillars 120 including the seed patterns 122 and the conductive vias 124 have been previously described in FIG. 6, and thus are not repeated herein for brevity. In some embodiments, the conductive pillars 120 may be InFO vias, vertical connectors, or vertical connections. In some embodiments, the conductive pillars 120 are arranged along but not on a cutting line (not shown) between two package structures (e.g., two of the package structures 200a).

Continued on FIG. 21, in some embodiments, the semiconductor die 140 is disposed on the redistribution circuit structure 110A and next to the conductive pillars 120. In some embodiments, the semiconductor die 140 is picked and placed over the redistribution circuit structure 110A and disposed in the trench TH formed in the dielectric layer 50 onto the surface TS118b of the dielectric layer 118b and the surface TS116b of the conductive layer 116b, where the semiconductor die 140 is laterally distant from the conductive pillars 120. In some embodiments, the semiconductor die 140 includes a semiconductor substrate 141 having an active surface 141t and a backside surface 141b opposite to the active surface 141t, a plurality of pads 142 distributed on the active surface 141t, a passivation layer 143 covering the active surface 141t and a portion of the pads 142, a post passivation layer 144 covering the passivation layer 143 and a portion of the pads 142, a plurality of conductive vias 145 connecting to the pads 142 exposing by the passivation layer 143 and the post passivation layer 144, and a protection layer 146 disposed on and covering the post passivation layer 144 and the conductive vias 145. The details of the semiconductor die 140 including the semiconductor substrate 141, the pads 142, the passivation layer 143, the post passivation layer 144, the conductive vias 145, and the protection layer 146 have been previously described in FIG. 6, and thus are not repeated herein for brevity. However, the disclosure may not be limited thereto. Alternatively, the illustrated top surfaces of the conductive vias 145 may be accessibly exposed by the protection layer 146. Or alternatively, the post passivation layer 144 and/or the protection layer 146 may be omitted. Or alternatively, the conductive vias 145 and the protection layer 146 are omitted, where the post passivation layer 144 may or may not be omitted.

In certain embodiments, additional semiconductor die(s) of the same type or different types may be included. The additional semiconductor die(s) may include digital chips, analog chips, or mixed signal chips, such as ASIC chips, sensor chips, wireless and RF chips, memory chips, logic chips, voltage regulator chips, or the like. The disclosure is not limited thereto. It should be appreciated that the illustration of the semiconductor die 140 and its components throughout all figures is schematic and is not in scale.

As illustrated in FIG. 21, in some embodiments, the semiconductor die 140 is bonded to the redistribution circuit structure 110A by adhering onto the redistribution circuit structure 110A with a connecting film 130. The semiconductor die 140 (e.g., the backside surface 141b thereof) may be adhered to the surface TS118b of the dielectric layer 118b and the surface TS116b of the conductive layer 116b of the redistribution circuit structure 110A by the connecting film 130. For example, as shown in FIG. 21, the connecting film 130 is sandwiched between the semiconductor die 140 and the redistribution circuit structure 110A. Owing to the connecting film 130, the semiconductor die 140 is stably adhered to the dielectric layer 118b and the conductive layer 116b of the redistribution circuit structure 110A. Owing to the coplanarity of the dielectric layer 118b (having the surface TS118b with high degree of coplanarity and flatness) and the conductive layer 116b, there is no or little air or void trapped between the connecting film 130 and the redistribution circuit structure 110A, thereby an undesired movement of the semiconductor die 140 and/or an insulating encapsulation 150 (see FIG. 22) surrounding the semiconductor die 140 and/or the moisture trapped by the void and/or the risk of "pop-corn" may be suppressed, which enhancing the reliability and performance of the package structure 200a.

The details of the connecting film 130 have been previously described in FIG. 6, and thus are not repeated herein for brevity. In some embodiments, a thickness H130 of the connecting film 130 is ranging from about 5 µm to about 200 µm. In the embodiments of which the connecting film 130 is the thermally conductive die attach film, the connecting film 130 thermally couples the semiconductor die 140 and the redistribution circuit structure 110A, which helps to dissipate heat from the semiconductor die 140; thus, the thickness H130 of the connecting film 130 can be thick to ensure a high surface coverage capability. In the embodiments of which the connecting film 130 is the non-thermally conductive die attach film, in order to allow the connecting film 130 being capable of thermally coupling the semiconductor die 140 and the redistribution circuit structure 110A for the heat dissipation of the semiconductor die 140, the thickness H130 of the connecting film 130 can be thin. In other words, the heat dissipation of the package structure 200a may be controlled (e.g., to be improved or maintained based on the demand and design requirements) by adjusting the thermal conductivity and/or the thickness H130 of the connecting film 130, for example, in the disclosure. In some embodiments, the connecting film 130 is disposed between the semiconductor die 140 and the conductive layer 116b (exposing by the dielectric layers 50 and 118b) of the redistribution circuit structure 110A. The conductive layer 116b exposed by the trench TH formed in the dielectric layer 50 and disposed underneath the semiconductor die 140 is thermally coupled to the semiconductor die 140, as shown in FIG. 21, for example. Owing to such configuration (e.g., the connecting film 140 directly contacting to the conductive layer 116), a heat dissipation of the heat generated from the semiconductor die 140 is further enhanced.

In FIG. 21, for example, the semiconductor die 140 and the conductive pillars 120 are arranged next to each other along the X-Y plane. In some embodiments, the semiconductor die 140 are not overlapped with the conductive pillars 120 in the direction Z, but are overlapped with each other in the direction X and/or the direction Y. In one embodiment, a height of the conductive pillars 120 is greater than a height of the semiconductor die 140, as shown in FIG. 21. Alternatively, the height of the conductive pillars 120 may be less than or substantially equal to the height of the semiconductor die 140. In some embodiments, the surface TS130 of the connecting film 130 is substantially leveled with the surface TS50 of the dielectric layer 50 in the direction Z, as shown in FIG. 21. However, the disclosure is not limited thereto; alternatively, the surface TS130 of the connecting film 130 may be lower than or higher than the surface TS50 of the dielectric layer 50 in the direction Z.

Figure 22:
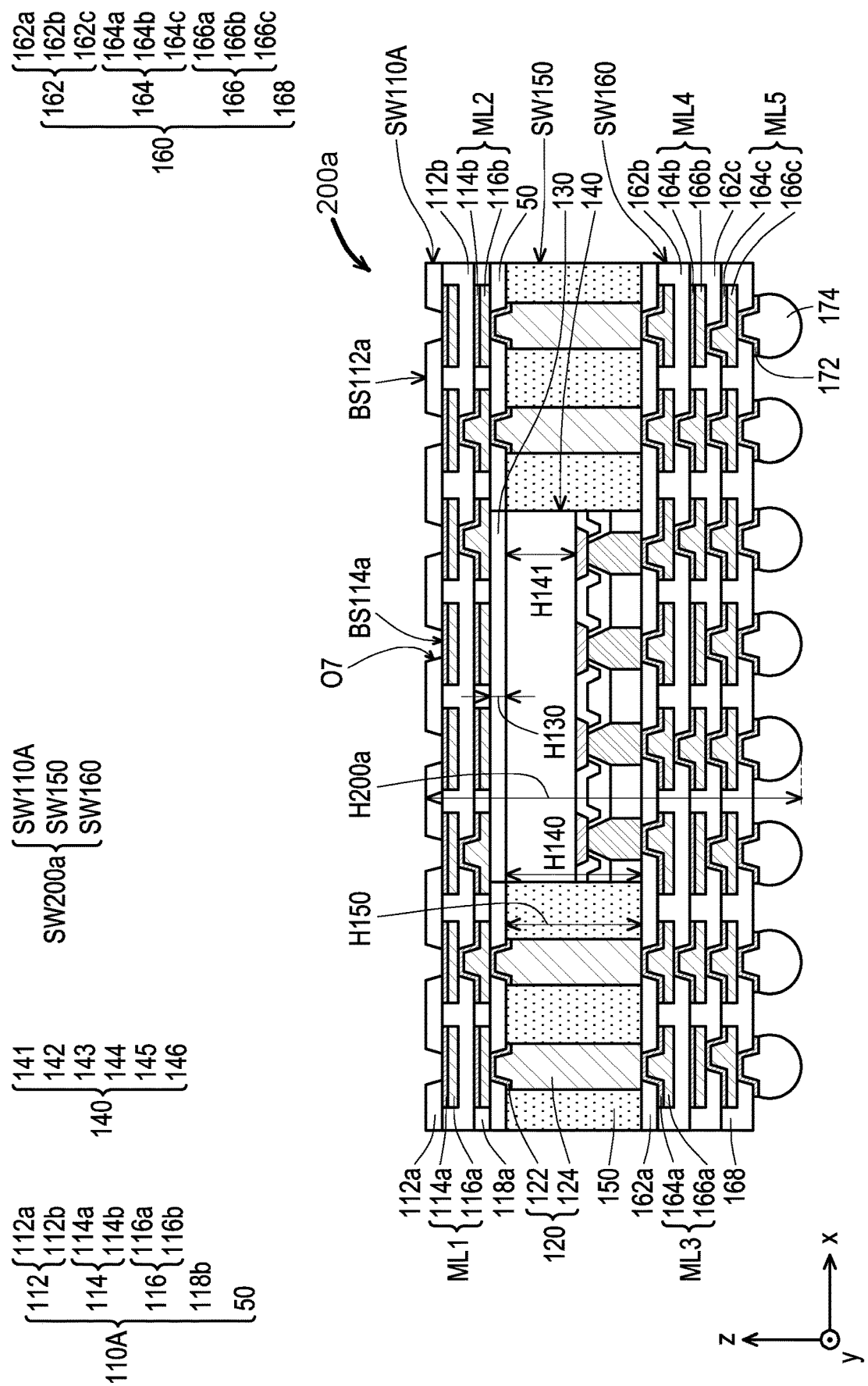

Referring to FIG. 22, in some embodiments, the processes as described in FIG. 7 through FIG. 13 are performed on the structure depicted in FIG. 21 to form the package structure 200*a*. For example, an insulating encapsulation 150 is disposed on (e.g., in physical contact with) the semiconductor die 140, the conductive pillars 120, and the redistribution circuit structure 110A exposed by the semiconductor die 140 and the conductive pillars 120. As illustrated in FIG. 22, the conductive pillars 120 and the semiconductor die 140 may be laterally encapsulated in the insulating encapsulation 150. In the case, a surface of the insulating encapsulation 150, surfaces of the conductive vias 145 of the semiconductor die 140, and surfaces of the conductive pillars 120 are substantially leveled with and substantially coplanar to each other. As show in FIG. 22, a thickness H150 of the insulating encapsulation 150 is less than a sum of the thickness H130 of the connecting film 130 and a thickness H140 of the semiconductor die 140, for example. In some embodiments, a redistribution circuit structure 160 is disposed on the conductive pillars 120, the semiconductor die 140 and the insulating encapsulation 150, and is electrically connected to the conductive pillars 120 and the semiconductor die 140. For example, at least some of the conductive pillars 120 are electrically coupled to the semiconductor die 140 through the redistribution circuit structure 160, and the redistribution circuit structure 110A is electrically coupled to the semiconductor die 140 through the redistribution circuit structure 160 and at least some of the conductive pillars 120.

A plurality of UBM patterns 172 are physically connected to and electrically connected to the redistribution circuit structure 160, for example. In the case, a plurality of conductive terminals 174 are physically connected and electrically connected to the UBM patterns 172, and are electrically coupled to the redistribution circuit structure 160 through the UBM patterns 172. In some embodiments, at least some of the conductive terminals 174 are electrically coupled to the semiconductor die 140 through the redistribution circuit structure 160 and respective ones of the UBM patterns 172. In some embodiments at least some of the conductive terminals 174 are electrically coupled to the redistribution circuit structure 110A through respective ones of the UBM patterns 172, the redistribution circuit structure 160, and at least some of the conductive pillars 120. However, the disclosure is not limited thereto. In some alternative embodiments, the UBM patterns 172 may be omitted. In such alternative embodiments, the conductive terminals 174 may be directly connected to (e.g., in physical contact with) the redistribution circuit structure 160 (e.g., the portions of the conductive layer 166*c* exposed by openings O6 formed in the dielectric layer 168). The conductive terminals 174 may be referred to as conductors or conductive connectors, in the disclosure.

As shown in FIG. 22, for example, the dielectric layer 112*a* includes a plurality of openings O7 each exposing a portion of the seed layer 114*a*. As show in FIG. 22, through the openings O7, a surface BS114*a* of the seed layer 114*a* is partially exposed for electrically connecting to later-formed connectors, for example. In other words, portions of the seed layer 114*a* exposed by the openings O7 may be referred to as conductive terminals, conductors, or conductive connectors, in the disclosure. In some embodiments, the package structure 200*a* is referred to as an InFO package, which has dual-side terminals (e.g., 114*a* and 174). In the disclosure, the redistribution circuit structure 160 may be referred to as a front-side redistribution circuit structure or layer of the semiconductor die 140, while the redistribution circuit structure 110A may be referred to as a back-side redistribution circuit structure or layer of the semiconductor die 140.

The details, formations, and materials of the insulating encapsulation 150, the redistribution circuit structure 160 (including a first building layer (having a dielectric layer 162*a* and a metallization layer ML3 (including a seed layer 164*a* and a conductive layer 166*a*)), a second building layer (having a dielectric layer 162*b* and a metallization layer ML4 (including a seed layer 164*b* and a conductive layer 166*b*)), a third building layer (having a dielectric layer 162*c* and a metallization layer ML5 (including a seed layer 164*c* and a conductive layer 166*c*)), and a dielectric layer 168), the UBM patterns 172, and the conductive terminals 174 have been previously described in FIG. 7 through FIG. 13, respectively; thus, are not repeated herein for brevity. In some embodiments, a sidewall SW110A of the redistribution circuit structure 110A, a sidewall SW150 of the insulating encapsulation 150, and a sidewall SW160 of the redistribution circuit structure 160 are substantially aligned to each other, in the package structure 200*a* depicted in FIG. 22. That is, the sidewall SW110A of the redistribution circuit structure 110A, the sidewall SW150 of the insulating encapsulation 150, and the sidewall SW160 of the redistribution circuit structure 160 together constitute a sidewall SW200*a* of the package structure 200*a*.

In one scenario of the disclosure, due to the dielectric layer 118*b* is thinned and the trench TH formed in the dielectric layer 50, an overall thickness H200*a* of the package structure 200*a* is reduced. In another scenario of the disclosure, due to the dielectric layer 118*b* is thinned and the trench TH formed in the dielectric layer 50, a thickness H141 of the semiconductor substrate 141 of the semiconductor die 140 is increased to facilitate the heat dissipation of the package structure 200*a*, where the overall thickness H200*a* of the package structure 200*a* is maintained the same. In another scenario of the disclosure, due to the dielectric layer 118*b* is thinned and the trench TH formed in the dielectric layer 50, the thickness H130 of the connecting film 130 (as being the thermally conductive die attach film) is increased to facilitate the heat dissipation of the package structure 200*a*, where the overall thickness H200*a* of the package structure 200*a* is maintained the same.

In one scenario of the disclosure, due to the dielectric layer 118*b* and the connecting film 130 (as being the non-thermally conductive die attach film) are thinned and the trench TH formed in the dielectric layer 50, an overall thickness H200*a* of the package structure 200*a* is reduced. In another scenario of the disclosure, due to the dielectric layer 118*b* and the connecting film 130 (as being the non-thermally conductive die attach film) are thinned and the trench TH formed in the dielectric layer 50, the thickness H141 of the semiconductor substrate 141 of the semiconductor die 140 is increased to facilitate the heat dissipation of the package structure 200a, where the overall thickness H200a of the package structure 200a is maintained the same.

Figure 23:
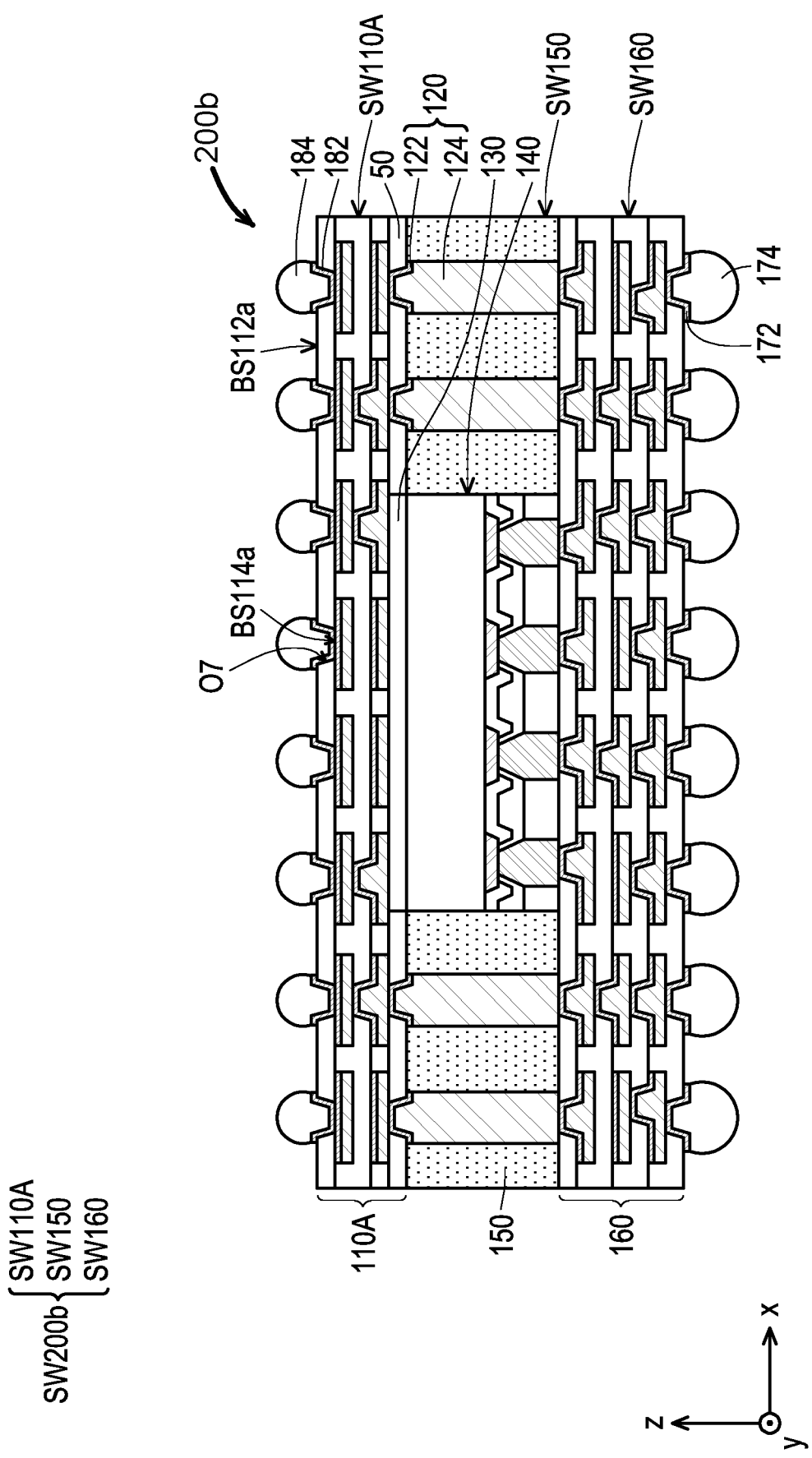
FIG. 23 is a schematic cross-sectional view of a package structure in accordance with some embodiments of the disclosure.

In addition, additional conductive terminals (e.g., UBM patterns 182 and/or conductive terminals 184) may be mounted to the package structure 200a, so to obtain another structure of InFO package having dual-side terminals. FIG. 23 is a schematic cross-sectional view of a package structure 200b in accordance with some embodiments of the disclosure. The elements similar to or substantially the same as the elements described previously will use the same reference numbers, and certain details or descriptions (e.g., the materials, formation processes, positioning configurations, electrical connection, etc.) of the same elements would not be repeated herein. In some embodiments, the UBM patterns 182 and the conductive terminals 184 are sequentially formed on the dielectric layer 112a of the redistribution circuit structure 110A. In some embodiments, the UBM patterns 182 each are located between a respective one of the conductive terminals 184 and the dielectric layer 112a. Due to the UBM patterns 182, the adhesion strength between the conductive terminals 184 and the dielectric layer 112a is enhanced. The formations and materials of the UBM patterns 182 and the conductive terminals 184 are similar to or substantially identical to the formations and materials of the UBM patterns 172 and the conductive terminals 174 as described in FIG. 10, respectively; thus, are not repeated herein for brevity.

Referring to FIG. 23, in some embodiments, the UBM patterns 182 are disposed on (e.g., in physical contact with) the seed layer 114a exposed by the openings O7 formed in the dielectric layer 112a. As shown in FIG. 23, for example, the UBM patterns 182 are physically connected to and electrically connected to the seed layer 114a of the redistribution circuit structure 110A. In some embodiments, the conductive terminals 184 are electrically coupled to the redistribution circuit structure 110A through the UBM patterns 182. In some embodiments, some of the conductive terminals 184 are electrically coupled to the conductive pillars 120 through some of the UBM patterns 182 and the redistribution circuit structure 110A. In some embodiments, some of the conductive terminals 184 are electrically coupled to the redistribution circuit structure 160 through some of the UBM patterns 182, the redistribution circuit structure 110A, and the conductive pillars 120. In some embodiments, some of the conductive terminals 184 are electrically coupled to the semiconductor die 140 through some of the UBM patterns 182, the redistribution circuit structure 110A, the conductive pillars 120, and the redistribution circuit structure 160. In some embodiments, some of the conductive terminals 184 are electrically coupled to the conductive terminals 174 through some of the UBM patterns 182, the redistribution circuit structure 110A, the conductive pillars 120, the redistribution circuit structure 160, and some of the UBM patterns 172.

However, the disclosure is not limited thereto. In alternative embodiments, the UBM patterns 182 are be omitted, where the conductive terminals 184 are directly connected to (e.g., in physical contact with) the redistribution circuit structure 110A (e.g., the portions of the seed layer 114a exposed by the openings O7). In such alternative embodiments, the conductive terminals 184 may be referred to as conductors or conductive connectors. In further alternative embodiments, the conductive terminals 184 are omitted, where the UBM patterns 182 are referred to as conductive terminals, conductors, or conductive connectors.

The package structure 200b may be referred to as an InFO package, which has dual-side terminals. The formation of the package structure 200b may include, but not limited to, forming the UBM patterns 182 and the conductive terminals 184 on the redistribution circuit structure 110A after forming the openings O7 in the dielectric layer 112a as described in FIG. 12 and prior to the dicing process as described in FIG. 13.

Figure 24:
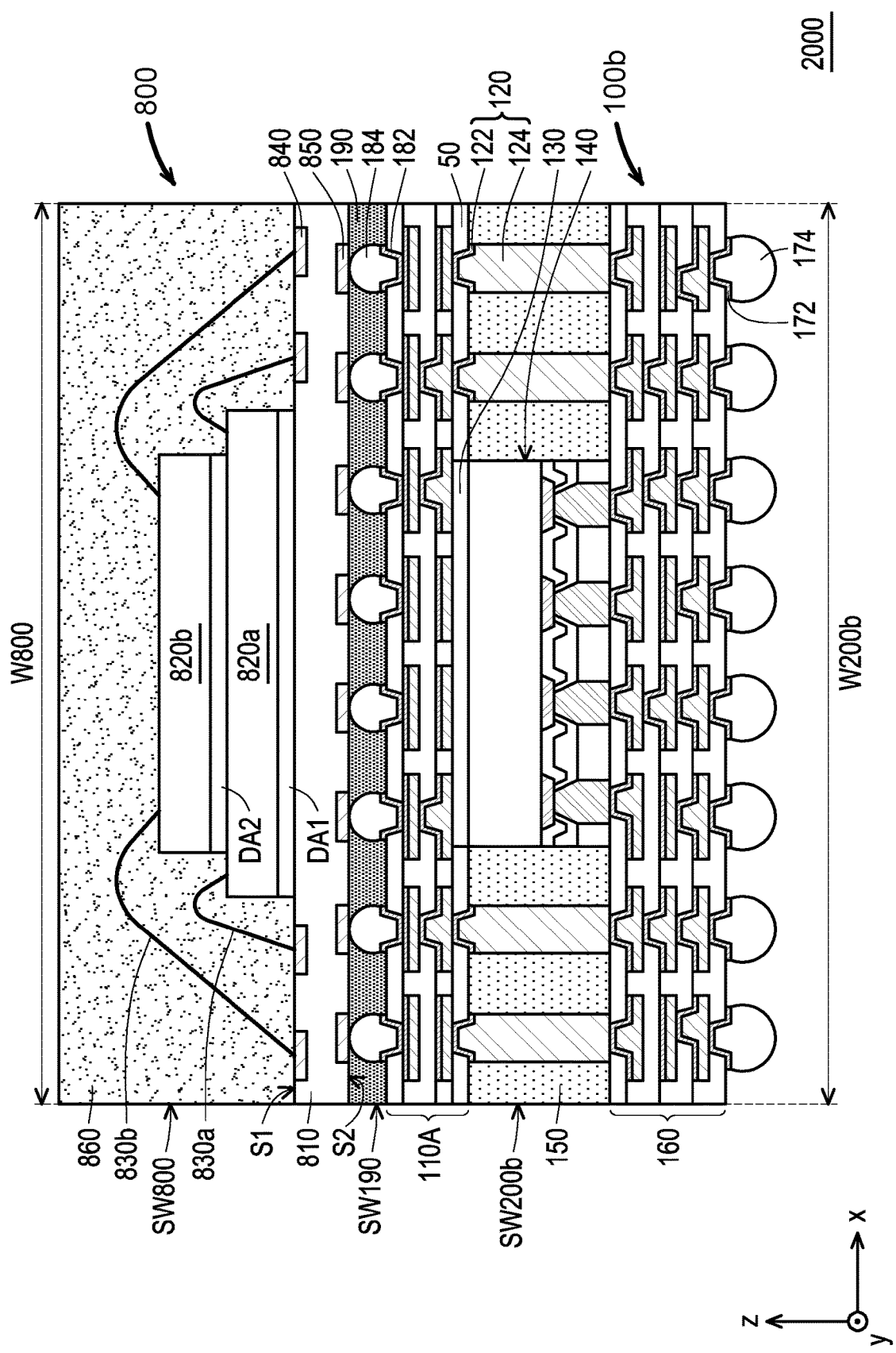
FIG. 24 is a schematic cross-sectional view of a package structure in accordance with some embodiments of the disclosure.

In addition, one or more than one package (such as a memory package or the like) may be mounted to the package structure 200a or 200b having a structure of InFO package to form a semiconductor package having a PoP structure. FIG. 24 is a schematic cross-sectional view of a package structure 2000 in accordance with some embodiments of the disclosure. The elements similar to or substantially the same as the elements described previously will use the same reference numbers, and certain details or descriptions (e.g., the materials, formation processes, positioning configurations, etc.) of the same elements would not be repeated herein. Referring to FIG. 24, in some embodiments, a package 800 is provided and bonded to the package structure 200b depicted in FIG. 23 to form the package structure 2000 having the PoP structure. In addition, as shown in FIG. 25, an insulating material 190 is optionally disposed in a gap between the package structure 200b and the package 800 and wraps around the conductive terminals 184 of the package structure 200b, for example. Owing to the insulating material 190, the bonding strength between the package structure 200b and the package 800 is enhanced, thereby improving the reliability of the package structure 2000. Alternatively, the insulating material 190 may be omitted. The details of the package 800 and its bonding method and the details of the insulating material 190 have been previously described in FIG. 15, and thus are not repeated herein for brevity. The package structure 2000 may be referred to as an InFO-PoP package.

The formation of the package structure 2000 may include, but not limited to, bonding the package 800 to the package structure 200b after forming the conductive terminals 184 as described in FIG. 14 and prior to the dicing process as described in FIG. 13; applying the insulating material 190 in the gap between the package structure 200b and the package 800; and performing the dicing process as described in FIG. 13 to cut through a plurality of the packages 800 interconnected therebetween, a plurality of the package structures 200b interconnected therebetween, and the insulating material 190 interposed therebetween into a plurality of individual and separated package structures 2000. For simplicity, only one package structure 2000 is illustrated in FIG. 24 for illustrative purposes. In some embodiments, after dicing, a sidewall SW800 of the package 800, a sidewall SW190 of the insulating material 190, and the sidewall SW200b of the package structure 200b are substantially aligned to each other, in the package structure 2000 depicted in FIG. 25. That is, the sidewall SW800 of the package 800, the sidewall SW190 of the insulating material 190, and the sidewall SW200b of the package structure 200b together constitute a sidewall of the package structure 2000. In the case, for the package structure 2000 of FIG. 25, a lateral size W800 of the package 800 is substantially equal to a lateral size W200b of the package structure 200b.

However, the disclosure is not limited thereto; alternatively, the formation of the package structure 2000 may include bonding the package 800 to the package structure 200b after forming the conductive terminals 184 as described in FIG. 14 and prior to the dicing process as described in FIG. 13; applying the insulating material 190 in the gap between the package structure 200b and the package 800; and performing the dicing process as described in FIG. 13 to cut through only the insulating material 190 and a plurality of the package structures 200b interconnected therebetween into individual and separated package structures 2000. In the case, the lateral size of the package 800 is less than the lateral size of the package structure 200b, where the sidewall of the package 800 is not aligned with the sidewall of the insulating material 190 and the sidewall of the package structure 200b. The sidewall of the package 800 may be free of the insulating material 190. The sidewall of the package 800 may be at least partially covered by the insulating material 190.

Or alternatively, the formation of the package structure 2000 may include bonding the package 800 to the package structure 200b after the dicing process as described in FIG. 13; and then applying the insulating material 190 in the gap between the package structure 200b and the package 800 to form the package structure 2000. In the case, the lateral size of the package 800 is may be less than, greater than, or substantially equal to the lateral size of the package structure 200b, where the sidewall of the package 800 is not aligned with the sidewall of the insulating material 190 and the sidewall of the package structure 200b. The sidewall of the package 800 may be free of the insulating material 190. The sidewall of the package 800 may be at least partially covered by the insulating material 190.

In some embodiments, the package structures 100a, 100b, 1000, 200a, 200b, and/or 2000 may be mounted to an additional semiconductor component to form an assembly by a wafer level packaging (WLP), a chip-on-wafer-on-substrate (CoWoS) process, a chip-on-chip-on-substrate (CoCoS) process, etc. The additional semiconductor component may include an interposer, a package substrate, a printed circuit board (PCB), a printed wiring board, and/or other carrier that is capable of carrying integrated circuits. The disclosure is not limited thereto. The assembly may be a part of an electronic system for such as computers (e.g., high-performance computer), computational devices used in conjunction with an artificial intelligence system, wireless communication devices, computer-related peripherals, entertainment devices, etc. The assembly including the semiconductor structure(s) discussed herein may provide high bandwidth data communication. It should be noted that other electronic applications are also possible. Alternatively, additional terminals may be physical and electrical contact with the additional semiconductor component opposite to the package structures 100a, 100b, 1000, 200a, 200b, and/or 2000 for electrical connection to any other external component(s).

In accordance with some embodiments, a package structure includes a package structure includes a first redistribution circuit structure, a semiconductor die, a connecting film, and a second redistribution circuit structure. The first redistribution circuit structure includes a dielectric structure and a routing structure disposed therein, where the dielectric structure includes a trench exposing the routing structure. The semiconductor die is disposed on and electrically coupled to the first redistribution circuit structure. The connecting film is disposed in the trench and between the semiconductor die and the first redistribution circuit structure, and the semiconductor die is thermally coupled to the routing structure through the connecting film. The second redistribution circuit structure is disposed on and electrically coupled to the semiconductor die, the second redistribution circuit structure is electrically coupled to the first redistribution circuit structure, and the semiconductor die is disposed between the first redistribution circuit structure and the second redistribution circuit structure.

In accordance with some embodiments, a package structure includes a package structure includes a first redistribution circuit structure, a semiconductor die, a connecting film, and a second redistribution circuit structure. The first redistribution circuit structure includes a metallization layer and a capping layer disposed over the metallization layer, where a first surface of the capping layer has a surface roughness being less than or substantially equal to 2 µm. The semiconductor die is disposed on the first surface of the capping layer and electrically coupled to the first redistribution circuit structure. The connecting film is disposed between the semiconductor die and the capping layer of the first redistribution circuit structure, and the semiconductor die is thermally coupled to the metallization layer through the connecting film. The second redistribution circuit structure is disposed on and electrically coupled to the semiconductor die, the second redistribution circuit structure is electrically coupled to the first redistribution circuit structure, and the semiconductor die is disposed between the first redistribution circuit structure and the second redistribution circuit structure.

In accordance with some embodiments, a method of manufacturing a package structure includes the following steps: forming a first redistribution circuit structure includes: forming a metallization layer; disposing a dielectric material over the metallization layer; and planarizing the dielectric material to form a capping layer over the metallization layer, a first surface of the capping layer having a surface roughness being less than or substantially equal to 2 µm; disposing a semiconductor die over the first surface of the capping layer through a connecting film, the connecting film being disposed between the semiconductor die and the capping layer of the first redistribution circuit structure, the semiconductor die being thermally coupled to the metallization layer through the connecting film; and forming a second redistribution circuit structure over the semiconductor die, the second redistribution circuit structure being electrically coupled to the first redistribution circuit structure, and the semiconductor die being disposed between and electrically coupled to the first redistribution circuit structure and the second redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a first redistribution circuit structure, comprising a first metallization layer, a capping layer disposed over the first metallization layer, a second metallization layer and a dielectric layer disposed over the second metallization layer, wherein a first surface of the capping layer has a surface roughness being less than or substantially equal to 2 µm;

a semiconductor die, disposed on the first surface of the capping layer and electrically coupled to the first redistribution circuit structure, wherein the second metallization layer is accessibly revealed by a surface of the dielectric layer facing away from the semiconductor die;

a connecting film, disposed between the semiconductor die and the capping layer of the first redistribution circuit structure, the semiconductor die being thermally coupled to the first metallization layer through the connecting film; and a second redistribution circuit structure, disposed on and electrically coupled to the semiconductor die, the second redistribution circuit structure being electrically coupled to the first redistribution circuit structure, and the semiconductor die being disposed between the first redistribution circuit structure and the second redistribution circuit structure.

2. The package structure of claim 1, wherein a second surface of the first metallization layer is partially exposed by a plurality of openings formed in the capping layer, wherein the second surface of the first metallization layer is lower than the first surface of the capping layer in a stacking direction of the first redistribution circuit structure and the semiconductor die.

3. The package structure of claim 2, wherein the capping layer comprising a single-layer structure.

4. The package structure of claim 1, wherein the capping layer comprises a first dielectric layer and a second dielectric layer disposed thereon, and the second dielectric layer comprises a trench exposing a surface of the first dielectric layer, wherein the surface of the first dielectric layer comprises the first surface of the capping layer, and wherein a second surface of the first metallization layer is exposed by the surface of the first dielectric layer, and the second surface of the first metallization layer is substantially coplanar to the surface of the first dielectric layer.

5. The package structure of claim 4, wherein a positioning location of the semiconductor die is within a positioning location of the trench in a vertical projection on the first redistribution circuit structure in a stacking direction of the first redistribution circuit structure and the semiconductor die.

6. The package structure of claim 1, further comprising:

a plurality of conductive pillars, disposed on the first metallization layer of the first redistribution circuit structure, the plurality of conductive pillars being next to the semiconductor die and electrically connecting the first redistribution circuit structure and the second redistribution circuit structure;

an insulating encapsulation, encapsulating the plurality of conductive pillars and the semiconductor die, the plurality of conductive pillars penetrating through the insulating encapsulation;

a plurality of first conductive terminals, disposed on and electrically coupled to the first redistribution circuit structure, the first redistribution circuit structure being disposed between the semiconductor die and the plurality of first conductive terminals; and a plurality of second conductive terminals, disposed on and electrically coupled to the second redistribution circuit structure, the second redistribution circuit structure being disposed between the semiconductor die and the plurality of second conductive terminals.

7. The package structure of claim 1, wherein the connecting film comprises a thermally conductive adhesive layer having a thermal conductivity being about 0.5 W/(m·K) to about 50 W/(m·K).

8. The package structure of claim 7, wherein the thermally conductive adhesive layer comprises a thermally conductive filler, and an amount of the thermally conductive filler presented in the thermally conductive adhesive layer is ranging from about 40% to about 95%.

9. A method of manufacturing a package structure, comprising:

forming a first redistribution circuit structure, comprising:
 forming a first metallization layer;
 disposing a dielectric material over the first metallization layer; and
 planarizing the dielectric material to form a capping layer over the first metallization layer, a first surface of the capping layer having a surface roughness being less than or substantially equal to 2 μm;

disposing a semiconductor die over the first surface of the capping layer through a connecting film, the connecting film being disposed between the semiconductor die and the capping layer of the first redistribution circuit structure, the semiconductor die being thermally coupled to the first metallization layer through the connecting film, the semiconductor die being electrically coupled to the first redistribution circuit structure; and forming a second redistribution circuit structure over the semiconductor die, the second redistribution circuit structure being electrically coupled to the first redistribution circuit structure and the semiconductor die, and the semiconductor die being disposed between and electrically coupled to the first redistribution circuit structure and the second redistribution circuit structure, wherein a second metallization layer of the second redistribution circuit structure is accessibly revealed by a surface of a dielectric layer of the second redistribution circuit structure, and the surface of the dielectric layer is facing away from the semiconductor die.

10. The method of claim 9, wherein forming the first redistribution circuit structure further comprises:

patterning the capping layer to form a plurality of openings exposing a second surface of the first metallization, wherein the second surface of the first metallization layer is lower than the first surface of the capping layer in a stacking direction of the first redistribution circuit structure and the semiconductor die.

11. The method of claim 9, wherein forming the capping layer further comprises:

forming an additional dielectric material over the planarized dielectric material; and patterning the additional dielectric material to form a trench penetrating therethrough, the trench exposes a surface of the planarized dielectric material and a second surface of the first metallization layer, wherein the surface of the planarized dielectric material comprises the first surface of the capping layer, wherein the second surface of the first metallization layer is exposed by the surface of the planarized dielectric material, and the second surface of the first metallization layer is substantially coplanar to the surface of the planarized dielectric material.

12. The method of claim 11, wherein disposing the semiconductor die over the first surface of the capping layer comprising adhering the semiconductor die onto the trench through the connecting film, wherein the connecting film is disposed in the trench.

13. The method of claim 9, wherein the connecting film is formed on a rear side of the semiconductor die and comprises a thermally conductive adhesive layer comprising a thermally conductive filler, and an amount of the thermally conductive filler presented in the thermally conductive adhesive layer is ranging from about 40% to about 95%.

14. The method of claim 9, further comprising:
forming a plurality of conductive pillars over the first redistribution circuit structure and next to the semiconductor die, the plurality of conductive pillars electrically connecting the first redistribution circuit structure and the second redistribution circuit structure;
encapsulating the plurality of conductive pillars, the semiconductor die and the connecting film in an insulating encapsulation;
disposing a plurality of first conductive terminals over the first redistribution circuit structure, the first redistribution circuit structure being disposed between the semiconductor die and the plurality of first conductive terminals; and
disposing a plurality of second conductive terminals over the second redistribution circuit structure, the second redistribution circuit structure being disposed between the semiconductor die and the plurality of second conductive terminals.

15. A package structure, comprising:
a first redistribution circuit structure, comprising a metallization layer and a capping layer disposed over the metallization layer, wherein a first surface of the capping layer has a surface roughness being less than or substantially equal to 2 μm;
a semiconductor die, disposed on the first surface of the capping layer and electrically coupled to the first redistribution circuit structure;
a connecting film, disposed between the semiconductor die and the capping layer of the first redistribution circuit structure, the semiconductor die being thermally coupled to the metallization layer through the connecting film, wherein the connecting film comprises a thermally conductive adhesive layer having a thermal conductivity being about 0.5 W/(m·K) to about 50 W/(m·K); and
a second redistribution circuit structure, disposed on and electrically coupled to the semiconductor die, the second redistribution circuit structure being electrically coupled to the first redistribution circuit structure, and the semiconductor die being disposed between the first redistribution circuit structure and the second redistribution circuit structure.

16. The package structure of claim 15, wherein a second surface of the metallization layer is partially exposed by a plurality of openings formed in the capping layer, wherein the second surface of the metallization layer is lower than the first surface of the capping layer in a stacking direction of the first redistribution circuit structure and the semiconductor die.

17. The package structure of claim 15, wherein the capping layer comprises a first dielectric layer and a second dielectric layer disposed thereon, and the second dielectric layer comprises a trench exposing a surface of the first dielectric layer, wherein the surface of the first dielectric layer comprises the first surface of the capping layer, and
wherein a second surface of the metallization layer is exposed by the surface of the first dielectric layer, and the second surface of the metallization layer is substantially coplanar to the surface of the first dielectric layer.

18. The package structure of claim 17, wherein a positioning location of the semiconductor die is within a positioning location of the trench in a vertical projection on the first redistribution circuit structure in a stacking direction of the first redistribution circuit structure and the semiconductor die.

19. The package structure of claim 15, further comprising:
a plurality of conductive pillars, disposed on the metallization layer of the first redistribution circuit structure, the plurality of conductive pillars being next to the semiconductor die and electrically connecting the first redistribution circuit structure and the second redistribution circuit structure;
an insulating encapsulation, encapsulating the plurality of conductive pillars and the semiconductor die, the plurality of conductive pillars penetrating through the insulating encapsulation;
a plurality of first conductive terminals, physically connected to and electrically coupled to the first redistribution circuit structure, the first redistribution circuit structure being disposed between the semiconductor die and the plurality of first conductive terminals; and
a plurality of second conductive terminals, physically connected to and electrically coupled to the second redistribution circuit structure, the second redistribution circuit structure being disposed between the semiconductor die and the plurality of second conductive terminals.

20. The package structure of claim 15, wherein the thermally conductive adhesive layer comprises a thermally conductive filler, and an amount of the thermally conductive filler presented in the thermally conductive adhesive layer is ranging from about 40% to about 95%.

* * * * *